(12) United States Patent
Yamaguchi et al.

(10) Patent No.: US 7,356,109 B2
(45) Date of Patent: Apr. 8, 2008

(54) APPARATUS FOR AND METHOD OF MEASURING CLOCK SKEW

(75) Inventors: Takahiro Yamaguchi, Tokyo (JP); Masahiro Ishida, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/585,526

(22) Filed: Oct. 23, 2006

(65) Prior Publication Data
US 2007/0036256 A1 Feb. 15, 2007

Related U.S. Application Data

(63) Continuation of application No. 09/813,923, filed on Mar. 20, 2001, now Pat. No. 7,127,018.

(51) Int. Cl.
*H04L 7/00* (2006.01)
(52) U.S. Cl. .................................. 375/371; 370/516
(58) Field of Classification Search ................ 375/226, 375/285, 371, 373, 375–376; 327/155–156, 327/158–159, 161, 269, 270; 702/66, 69, 702/72, 79, 89; 370/516–519; 713/500–501, 713/503
See application file for complete search history.

(56) References Cited

U.S. PATENT DOCUMENTS

| | | | | |
|---|---|---|---|---|
| 4,860,322 A | * | 8/1989 | Lloyd | ........................ 375/356 |
| 5,003,256 A | * | 3/1991 | Merrill | ....................... 714/814 |
| 5,754,437 A | | 5/1998 | Blazo | |
| 5,852,640 A | * | 12/1998 | Kliza et al. | .................. 375/356 |
| 6,327,274 B1 | * | 12/2001 | Ravikanth | ................... 370/516 |
| 6,384,649 B1 | * | 5/2002 | Boerstler et al. | ........... 327/156 |
| 6,400,129 B1 | | 6/2002 | Yamaguchi et al. | |
| 6,519,281 B1 | * | 2/2003 | Taylor | ........................ 375/226 |
| 6,621,860 B1 | * | 9/2003 | Yamaguchi et al. | ........ 375/226 |
| 6,661,810 B1 | * | 12/2003 | Skelly et al. | ............... 370/516 |
| 6,795,496 B1 | * | 9/2004 | Soma et al. | ................. 375/226 |

FOREIGN PATENT DOCUMENTS

| | | |
|---|---|---|
| DE | 10006551 | 11/2000 |
| DE | 10080443 | 3/2001 |
| WO | WO 9939216 | 8/1999 |

OTHER PUBLICATIONS

Yamaguchi T. et al: "Extraction of peak-to-peak and RMS sinusoidal jitter using an analytic signal method" VLSI Test Symposium, 2000. Proceedings. 18th IEEE Montreal,, Canada Apr. 30-May 4, 2000, Los Alamitos, CA, USA,IEEE Comput. Soc, US, Apr. 30, 2000 (Apr. 30, 2004), pp. 395-402.

* cited by examiner

*Primary Examiner*—Khanh C. Tran
(74) *Attorney, Agent, or Firm*—David N. Lathrop, Esq.; Gallagher & Lathrop

(57) ABSTRACT

Timing jitter sequences $\Delta\phi^j[n]$ and $\Delta\phi^k[n]$ of respective clock signals under measurement $x_j(t)$ and $x_k(t)$ are estimated, and a timing difference sequence between those timing jitter sequences is calculated. In addition, initial phase angles $\phi_0^j$ and $\phi_0^k$ of linear instantaneous phases of the $x_j(t)$ and $x_k(t)$ are estimated, respectively. A sum of a difference between those initial angles and the timing difference sequence is calculated to obtain a clock skew sequence between the $x_j(t)$ and $x_k(t)$.

45 Claims, 20 Drawing Sheets

102 DETERMINISTIC CLOCK SKEW ESTIMATOR

1500 ANALYTIC SIGNAL TRANSFORMER

APPARATUS FOR AND METHOD OF MEASURING CLOCK SKEW

BACKGROUND OF THE INVENTION

The present invention relates to a clock skew measurement apparatus and a clock skew measurement method by which a skew between a plurality of clock signals distributed by a clock distribution circuit is measured.

A clock skew has conventionally been estimated statistically using a time interval analyzer or a frequency counter. That is, as shown in FIG. 1, for example, when a reference clock signal $CLK_g$ from a clock signal source 11 is distributed and supplied to registers 12$j$ and 12$k$, each of the clocks under measurement $CLK_j$ and $CLK_k$ in the respective registers 12$j$ and 12$k$ is inputted to a time interval analyzer 13, where a timing difference between a zero-crossing point of the clock signal under measurement $CLK_j$ and a zero-crossing point of the clock signal under measurement $CLK_k$ is measured, and a fluctuation of the timing difference is measured by a histogram analysis. An example of clock skew measurement using a time interval analyzer 13 is described in, for example, "Jitter Analysis Clock Solutions", Wavecrest Corp., 1998.

However, there is a problem in this clock skew measurement method using the time interval analyzer that it takes a long time to acquire a number of data required for the histogram analysis since, it requires an intermediate deadtime until clock skew measurement can be repeated. In addition, in the clock skew measurement method using the time interval analyzer, a skew between clocks having different frequencies cannot be measured. Therefore, a new clock skew measurement method is required for a precise control of a local clock and a global clock.

It is an object of the present invention to provide a measurement apparatus of a skew between clocks and its method by which a skew between clocks can be measured in a short time compared with a conventional apparatus and its method.

It is another object of the present invention to provide a measurement apparatus of a skew between clocks and its method by which a skew between clocks having different frequencies can be estimated.

SUMMARY OF THE INVENTION

The clock skew measurement apparatus according to the present invention comprises timing jitter estimation means for estimating timing jitter sequences of a plurality of clock signals under measurement, and clock skew estimation means to which the plurality of timing jitter sequences are inputted for calculating a timing difference sequence between the plurality of timing jitter sequences to output a clock skew sequence.

In addition, it is desirable that the clock skew measurement apparatus includes second clock skew estimation means to which the clock skew sequences are inputted for obtaining a difference between the plurality of clock skew sequences.

In addition, it is desirable that the clock skew measurement apparatus includes frequency multiplication means to which the timing jitter sequence is inputted for multiplying a frequency of the timing jitter sequence to output a timing jitter sequence of the frequency-multiplied clock signal under measurement.

In addition, it is desirable that the clock skew measurement apparatus includes deterministic clock skew estimation means for estimating a timing error between ideal clock edges of the plurality of clock signals under measurement to output a deterministic component of clock skew.

In addition, it is desirable that the clock skew measurement apparatus includes clock skew detection means to which the clock skew sequence is inputted for obtaining clock skew values between the clock signals under measurement from the clock skew sequence.

In addition, it is desirable in the clock skew measurement apparatus that the timing jitter estimation means comprises analytic signal transformation means for transforming a clock signal under measurement into a complex analytic signal, instantaneous phase estimation means for obtaining an instantaneous phase of the analytic signal, linear phase removing means for removing a linear instantaneous phase from the instantaneous phase to obtain an instantaneous phase noise, and zero-crossing sampling means to which the instantaneous phase noise is inputted for sampling only the instantaneous phase noise data at timings close to zero-crossing timings of a real part of the analytic signal to output a timing jitter sequence.

In addition, it is desirable in the clock skew measurement apparatus that the analytic signal transformation means comprises bandpass processing means to which the clock signal under measurement is supplied for extracting only components around a fundamental frequency from the clock signal under measurement to band-limit the clock signal under measurement, and Hilbert transformation means for Hilbert-transforming an output signal of the bandpass processing means to generate a Hilbert pair of the input signal.

In addition, it is desirable in the clock skew measurement apparatus that the analytic signal transformation means comprises time domain to frequency domain transformation means to which the clock signal under measurement is supplied for transforming the clock signal under measurement into a both-sided spectrum signal in frequency domain, band-limiting means for extracting only components around a positive fundamental frequency of the clock signal under measurement in the both-sided spectrum signal, frequency domain to time domain transformation means for inverse-transforming an output of the band-limiting means into a signal in time domain.

In addition, it is desirable in the clock skew measurement apparatus that the analytic signal transformation means comprises a buffer memory to which the clock signal under measurement is supplied for storing therein the clock signal under measurement, means for extracting the signal in the sequential order from the buffer memory such that the signal being extracted is partially overlapped with the signal extracted just before, means for multiplying each extracted partial signal by a window function, means for transforming each partial signal multiplied by the window function into a both-sided spectrum signal in frequency domain, band-limiting means for extracting only components around a positive fundamental frequency of the clock signal under measurement from the transformed both-sided spectrum signal in frequency domain, means for inverse-transforming an output of the band-limiting means into a signal in time domain, and means for multiplying the transformed signal in time domain by an inverse number of the window function to obtain a band-limited analytic signal.

In addition, it is desirable that the clock skew measurement apparatus includes AD conversion means to which the clock signal under measurement is inputted for digitizing an analog signal to convert it to a digital signal.

In addition, it is desirable that the clock skew measurement apparatus includes waveform clipping means to which the clock signal under measurement is inputted for removing amplitude modulation components of the clock signal under measurement to extract only phase modulation components of the clock signal under measurement.

In addition, it is desirable in the clock skew measurement apparatus that the clock skew detection means is peak-to-peak detection means for obtaining a difference between the maximum value and the minimum value of the supplied clock skew sequence In addition, it is desirable in the clock skew measurement apparatus that the clock skew detection means is RMS detection means for obtaining a root-mean-square value (RMS value) of the supplied clock skew sequence.

In addition, it is desirable in the clock skew measurement apparatus that the clock skew detection means is histogram estimation means for obtaining a histogram of the supplied clock skew sequence.

In addition, it is desirable in the clock skew measurement apparatus that a pass bandwidth of the clock signal under measurement is variable in the analytic signal transformation means.

In addition, it is desirable in the clock skew measurement apparatus that the timing jitter estimation means further includes low frequency phase noise removing means to which the instantaneous phase noise is inputted for removing low frequency components of the instantaneous phase noise to output the instantaneous phase noise from which the low frequency components have been removed to the zero-crossing sampling means.

In addition, the clock skew measurement method according to the present invention includes a step of estimating timing jitter sequences of a plurality of clock signals under measurement, and a step of calculating a timing difference sequence between the plurality of timing jitter sequences to estimate a clock skew sequence.

In addition, it is desirable that the clock skew measurement method includes a step of obtaining a difference between the plurality of clock skew sequences, to estimate a clock skew sequence.

In addition, it is desirable that the clock skew measurement method includes a step of assigning the timing jitter values of the timing jitter sequence to provide a timing jitter sequence that corresponds to the frequency-multiplied clock signal under measurement.

In addition, it is desirable that the clock skew measurement method includes a step of estimating a timing error between ideal clock edges of the plurality of clock signals under measurement to estimate a deterministic component of clock skew.

In addition, it is desirable that the clock skew measurement method includes a step of obtaining clock skew values of the clock signals under measurement from the clock skew sequence.

In addition, it is desirable in the clock skew measurement method that the step of estimating a timing jitter sequence includes a step of transforming a clock signal under measurement into a complex analytic signal, a step of obtaining an instantaneous phase of the clock signal under measurement from the analytic signal, a step of removing a linear instantaneous phase from the instantaneous phase to obtain an instantaneous phase noise, and a step of sampling, using the instantaneous phase noise as an input, only the instantaneous phase noise data at timings close to zero-crossing timings of a real part of the analytic signal to output a timing jitter sequence.

In addition, it is desirable in the clock skew measurement method that the step of transforming the clock signal under measurement into an analytic signal includes a step of extracting only components around a fundamental frequency from the clock signal under measurement to band-limit the clock signal under measurement, and a step of Hilbert-transforming an output signal of the band-limiting processing means to generate a Hilbert pair of the input signal.

In addition, it is desirable in the clock skew measurement method that the step of transforming the clock signal under measurement into an analytic signal includes a step of transforming the clock signal under measurement into a both-sided spectrum signal in frequency domain, a step of extracting only components around a positive fundamental frequency of the clock signal under measurement in the both-sided spectrum signal, and a step of inverse-transforming an output of the band-limiting means into a signal in time domain.

In addition, it is desirable in the clock skew measurement method that the step of transforming the clock signal under measurement into an analytic signal includes a step of storing the clock signal under measurement in a buffer memory, a step of extracting the signal in the sequential order from the buffer memory such that the signal being extracted is partially overlapped with the signal extracted just before, a step of multiplying each extracted partial signal by a window function, a step of transforming each partial signal multiplied by the window function into a both-sided spectrum signal in frequency domain, a step of extracting only components around a positive fundamental frequency of the clock signal under measurement from the transformed both-sided spectrum signal in frequency domain, a step of inverse-transforming the band-limited spectrum signal into a signal in time domain, and a step of multiplying the transformed signal in time domain by an inverse number of the window function to obtain a band-limited analytic signal.

In addition, it is desirable in the clock skew measurement method that the step of estimating a deterministic component of clock skew between the clock signals under measurement includes a step of using the instantaneous linear phases of the plurality of clock signals under measurement as inputs and obtaining a difference between initial phase angles of the instantaneous linear phases to obtain a deterministic component of clock skew.

In addition, it is desirable in the clock skew measurement method that the step of estimating a deterministic component of clock skew between the clock signals under measurement includes a step of using the timing jitter sequences of the plurality of clock signals under measurement as inputs and obtaining a correlation between the timing jitter sequences to estimate strongly correlated clock edges and to obtain an offset value that relates two clock edge with each other.

In addition, it is desirable in the clock skew measurement method that the step of estimating a deterministic component of clock skew between the clock signals under measurement includes a step of using the plurality of clock signals under measurement as inputs for obtaining a mean value of zero-crossing timing errors between the clock signals under measurement to obtain a deterministic component of clock skew.

In addition, it is desirable that the clock skew measurement method includes a step of performing a waveform clipping of the clock signal under measurement in order to remove amplitude modulation components of the clock signal under measurement and extract only phase modulation components of the clock signal under measurement.

In addition, it is desirable in the clock skew measurement method that in the step of obtaining the clock skew value, a difference between the maximum value and the minimum value of the clock skew sequence is obtained to calculate a peak-to-peak value.

In addition, it is desirable in the clock skew measurement method that in the step of obtaining the clock skew value, a root-mean-square value of the clock skew sequence is obtained to calculate an RMS value.

In addition, it is desirable in the clock skew measurement method that in the step of obtaining the clock skew value, a histogram data of the clock skew sequence is obtained.

In addition, it is desirable in the clock skew measurement method that the step of estimating the timing jitter further includes a step of using the instantaneous phase noise as an input for removing low frequency components of the instantaneous phase noise.

The principle of the present invention will be explained. In this explanation, a clock signal in a microprocessor unit is used as a clock signal under measurement.

Clock Skew Measurement Method

First, a clock skew will be defined. As shown in FIG. 2, a clock skew is given by the difference between delay times $\tau_{cd}^j$ and $\tau_{cd}^k$ of the clock signals $CLK_j$ and $CLK_k$ to arrive at the respective registers $12j$ and $12k$ when the clock signals $CLK_j$ and $CLK_k$ are derived from a reference clock signal $CLK_g$ of a clock signal source $11$ as a reference time point of, for example, a clock distribution network. That is, the difference is given by an equation (1).

$$T_{Skew}^{j,k}(nT) = \tau_{cd}^k(nT) - \tau_{cd}^j(nT) \quad (1)$$

FIG. 3 shows by dotted lines an ideal reference clock signal $CLK_g$ having a fundamental period T, and ideal clock signals $CLK_j$ and $CLK_k$. Also shown in FIG. 3 are a difference $\tau_{cd}^j$ (nT) between an actual rising edge of the reference clock $CLK_g$ and an actual rising edge of the clock signal $CLK_j$, a difference $\tau_{cd}^k$ (nT) between the rising edge of the reference clock $CLK_g$ and a rising edge of the clock signal $CLK_k$ (n=0, 1, 2, . . . ), and a difference between the $\tau_{cd}^j$ (nT) and $\tau_{cd}^k$ (nT), i.e., a clock skew $T_{skew}^{j,k}$ (nT).

As shown in FIG. 4, it is assumed that rising edges of the clock signals $CLK_g$, $CLK_j$ and $CLK_k$ occur at time $t_{cd}^g$ (nT), $t_{cd}^j$ (nT) and $t_{cd}^k$ (nT) respectively, and ideal clock edges (clock edges correspond to jitter-free clock signals) of the clock signals $CLK_g$, $CLK_j$ and $CLK_k$ rise at time $(nT)_g$, $(nT)_j$ and $(nT)_k$ respectively. Then the delay time $\tau_{cd}^j$ (nT) or $\tau_{cd}^k$ (nT) between the clock departure of the clock signal $CLK_j$ or $CLK_k$ and the arrival at the respective registers $12j$ or $12k$ is expressed by following equation.

$$\tau_{cd}^j(nT) = t_{cd}^j(nT) - t_{cd}^g(nT) \quad (2)$$
$$= [t_{cd}^j(nT) - (nT)_j] - [t_{cd}^g(nT) - (nT)_g] + \{(nT)_j - (nT)_g\}$$
$$= \tau_{Skew}^{g,j} + \left[\Delta\phi^j[n]\left(\frac{T_j}{2\pi}\right) - \Delta\phi^g[n]\left(\frac{T_k}{2\pi}\right)\right] \text{ [sec]}$$

-continued
$$\tau_{cd}^k(nT) = t_{cd}^k(nT) - t_{cd}^g(nT) \quad (3)$$
$$= [t_{cd}^k(nT) - (nT)_k] - [t_{cd}^g(nT) - (nT)_g] + \{(nT)_k - (nT)_g\}$$
$$= \tau_{Skew}^{g,k} + \left[\Delta\phi^k[n]\left(\frac{T_k}{2\pi}\right) - \Delta\phi^g[n]\left(\frac{T_g}{2\pi}\right)\right] \text{ [sec]}$$

In this case, $$\tau_{Skew}^{g,j} = (nT)_j - (nT)_g \text{ [sec]} \quad (4)$$

and $$\tau_{Skew}^{g,k} = (nT)_k - (nT)_g \text{ [sec]} \quad (5)$$

are a time difference between an ideal clock edge of the clock signal $CLK_j$ and an ideal clock edge of the reference clock signal $CLK_g$, and a time difference between an ideal clock edge of the clock signal $CLK_k$ and an ideal clock edge of the reference clock signal $CLK_g$, respectively, and those time differences correspond to deterministic components of clock skew (deterministic clock skew values) that are determined by their respective paths. In addition, $\Delta\phi^g[n](T_g/2\pi)$ $(=t_{cd}^g(nT)-(nT)_g)$, $\Delta\phi^j[n](T_j/2\pi)$ $(=t_{cd}^j(nT)-(nT)_j)$ and $\Delta\phi^k[n](T_k/2\pi)$ $(=t_{cd}^k(nT)-(nT)_k)$ express timing jitter sequences (each unit is second) of the clock signals $CLK_g$, $CLK_j$ and $CLK_k$, respectively. When the equations (2) and (3) are substituted in the equation (1), a clock skew $T_{Skew}^{j,k}$ between the clock signal $CLK_j$ and the clock signal $CLK_k$ is expressed by the following equation.

$$T_{Skew}^{j,k}[n] = \left\{\tau_{Skew}^{g,k} + \left[\Delta\phi^k[n]\left(\frac{T_k}{2\pi}\right) - \Delta\phi^g[n]\left(\frac{T_g}{2\pi}\right)\right]\right\} - \quad (6)$$
$$\left\{\tau_{Skew}^{g,j} + \left[\Delta\phi^j[n]\left(\frac{T_j}{2\pi}\right) - \Delta\phi^g[n]\left(\frac{T_g}{2\pi}\right)\right]\right\}$$
$$= \tau_{Skew}^{j,k} + \left[\Delta\phi^k[n]\left(\frac{T_k}{2\pi}\right) - \Delta\phi^j[n]\left(\frac{T_j}{2\pi}\right)\right] \text{ [sec]}$$

The Second Term $$\left[\Delta\phi^k[n]\left(\frac{T_k}{2\pi}\right) - \Delta\phi^j[n]\left(\frac{T_j}{2\pi}\right)\right]$$

of the equation (6) corresponds to a random spread (random components) of clock skew caused by timing jitter of each clock signal. Then in the clock skew measurement method according to the present invention, an random distribution is obtained by combining quantities each representing how much a clock edge of each clock signal is deviated from an ideal clock edge, i.e., timing jitters of the clock signals. In this case, it is assumed that the fundamental period of the distributed clock signal $CLK_j$ is generally equal to the fundamental period of the distributed clock signal $CLK_k$ ($T_j=T_k$). In addition, $$\tau_{Skew}^{j,k} = (nT)_k - (nT)_j \text{ [sec]} \quad (7)$$

is a difference between a rising edge of an ideal clock of the clock signal $CLK_j$ and a rising edge of an ideal clock of the clock signal $CLK_k$, and this $\tau_{Skew}^{j,k}$ is a deterministic component of clock skew determined by the paths of clock distribution network.

A deterministic clock skew value $\tau_{Skew}^{j,k}$ can be obtained by, for example, obtaining instantaneous phases of corresponding two clock signals under measurement $CLK_j$ and $CLK_k$, and then by calculating a difference between their linear phase components. Fundamental components of the clock signals $CLK_j$ and $CLK_k$ are expressed as cosine waves by following equations (8) and (9), respectively.

$$x_j(t) = A_j\cos(\phi^j(t)) = A_j\cos\left(\left(\frac{2\pi}{T_j}\right)t + \phi_0^j - \Delta\phi^j(t)\right) \quad (8)$$

$$x_k(t) = A_k\cos(\phi^k(t)) = A_k\cos\left(\left(\frac{2\pi}{T_k}\right)t + \phi_0^k - \Delta\phi^k(t)\right) \quad (9)$$

Here, each of instantaneous phases $\phi^j(t)$ and $\phi^k(t)$ of the respective $x_j(t)$ and $x_k(t)$ is expressed by a sum of a linear instantaneous phase component $2\pi/T_L$ (L=j, k) corresponding to a fundamental period $T_L$ (L=j, k), an initial phase angle $\phi_0^L$ (L=j, k), and an instantaneous phase noise component $\Delta\phi^L(t)$ (L=j, k).

$$\phi^j(t) = \left(\frac{2\pi}{T_j}\right)t + \phi_0^j - \Delta\phi^j(t) \quad [rad] \quad (10)$$

$$\phi^k(t) = \left(\frac{2\pi}{T_k}\right)t + \phi_0^k - \Delta\phi^k(t) \quad [rad] \quad (11)$$

An estimation method of an instantaneous phase of a clock signal will be explained later. In the equations (10) and (11), when $\Delta\phi(t)=0$ is assumed, linear instantaneous phases of the respective jitter-free clock signals $CLK_j$ and $CLK_k$ can be estimated by following equations.

$$\phi_{linear}^j(t) = \left(\frac{2\pi}{T_j}\right)t + \phi_0^j \quad [rad] \quad (12)$$

$$\phi_{linear}^k(t) = \left(\frac{2\pi}{T_k}\right)t + \phi_0^k \quad [rad] \quad (13)$$

In this case, the ideal rising edge of the respective clock signals $CLK_j$ and $CLK_k$ occur at time $(nT)_j$ or $(nT)_k$ when each linear instantaneous phase of the left side becomes $(2n\pi-\pi/2)$. And the following relations can be obtained from the equations (12) and (13), respectively.

$$(nT)_j = \left(2n\pi - \left(\frac{\pi}{2}\right) - \phi_0^j\right)\left(\frac{T_j}{2\pi}\right) \quad [sec] \quad (14)$$

$$(nT)_k = \left(2n\pi - \left(\frac{\pi}{2}\right) - \phi_0^k\right)\left(\frac{T_k}{2\pi}\right) \quad [sec] \quad (15)$$

Therefore, the equations (14) and (15) are substituted in the equation (7) to obtain the deterministic clock skew value $\tau_{Skew}^{j,k}$ by the following equation.

$$\tau_{Skew}^{j,k} = (nT)_k - (nT)_j \quad (16)$$

$$= \left(2n\pi - \left(\frac{\pi}{2}\right) - \phi_0^k\right)\left(\frac{T_k}{2\pi}\right) - \left(2n\pi - \left(\frac{\pi}{2}\right) - \phi_0^j\right)\left(\frac{T_j}{2\pi}\right)$$

-continued $$= \phi_0^j\left(\frac{T_j}{2\pi}\right) - \phi_0^k\left(\frac{T_k}{2\pi}\right) = (\phi_0^j - \phi_0^k)\frac{T_0}{2\pi} \quad [sec]$$

In general, the fundamental periods of the respective clock signals $CLK_j$ and $CLK_k$ are the same ($T_j=T_k$). That is, a deterministic clock skew value between the two clock signals under measurement can be obtained as a difference between initial phase angles $\phi_0^j$ and $\phi_0^k$ in the linear instantaneous phases of the respective two clock signals under measurement.

Here, an initial phase angle $\phi_0$ of a clock signal under measurement can be obtained by applying a linear line fitting by least squares method to an instantaneous phase $\phi(k)$ (k is a digitizing time point), and by selecting $\hat{\phi}_0$ so that a formula (17) becomes minimum.

$$\sum_{k=1}^{N}\left(\phi(k) - (\hat{\omega}_0 k + \hat{\phi}_0)\right)^2 \quad (17)$$

In this case, an initial phase angle to be obtained is given by the following equation (18).

$$\hat{\phi}_0 = \frac{2(2N+1)\sum_{k=1}^{N}\phi(k) - 6\sum_{k=1}^{N}k\phi(k)}{N(N-1)} \quad (18)$$

A parameter estimation by a linear line fitting is described in, for example, "Random Data: Analysis and Measurement Procedure" by J. S. Bendat and A. G. Piersol, 2nd ed., John Wiley & Sons, Inc., p. 362, 1986.

In addition, an initial phase angle $\phi_0$ of a clock signal under measurement x(t) can be obtained by applying a cosine wave fitting by least squares method to a clock waveform data x(k) or its fundamental sine wave component, and by estimating $\hat{\phi}_0$ using a maximum likelihood estimation method so that a formula (19) becomes minimum.

$$\sum_{k=1}^{N}\left(x(k) - A\cos\left(\left(\frac{2\pi}{T}\right)k + \hat{\phi}_0\right)\right)^2 \quad (19)$$

In this case, an initial phase angle to be obtained is given by the following equation (20).

$$\hat{\phi}_0 = -\arctan\left(\frac{\sum_{k=1}^{N}x(k)\sin\frac{2\pi}{T}k}{\sum_{k=1}^{N}x(k)\cos\frac{2\pi}{T}k}\right) \quad (20)$$

A parameter estimation by a maximum likelihood estimator is described in, for example, "Fundamentals of Statistical Signal Processing: Estimation Theory" by S. M. Kay, Prentice-Hall Inc., pp. 167-172, 1993.

In the above description, it is assumed that corresponding clock edges of the two clock signals under measurement are not spaced apart from each other equal to or more than one period. When the corresponding clock edges of the two clock signals under measurement are spaced apart from each other equal to or more than one period, a deterministic clock skew value is given by a sum of the difference between the initial phase angles and an offset time $n_{offset}T_0$ of a clock edge, i.e., by the following equation (21).

$$T_{Skew}^{j,k} = (\phi_0^j - \phi_0^k)\left(\frac{T_0}{2\pi}\right) + n_{offset}T_0 \text{ [sec]} \quad (21)$$

A clock signal distributed from the clock signal source has a strong cause-and-result relationship with a clock signal of the clock signal source. As a result, in general, a phase noise (timing jitter sequence) of a distributed clock signal shows a tendency similar to that of a phase noise (timing jitter sequence) of the clock signal source. For this reason, timing jitter sequences $\Delta\phi^j[n]$ and $\Delta\phi^k[n]$ of the respective clock signals $CLK_j$ and $CLK_k$ distributed from the same clock signal source show mutually similar tendencies as shown in, for example, FIG. 5A and FIG. 5B. Therefore, an amount of offset time $n_{offset}$ of the corresponding clock edges of the respective clock signals $CLK_j$ and $CLK_k$ can be estimated by calculating a correlation function between the timing jitter sequences $\Delta\phi^j[n]$ and $\Delta\phi^k[n]$, and by searching an offset value at which the correlation function shows the maximum value. In summary, the amount of offset $n_{offset}$ of the clock edges can be obtained from an offset position at which the cross-correlation between the instantaneous phase noises show the maximum value.

In addition, a deterministic clock skew value can also be obtained by obtaining zero-crossing time points of respective clock signals under measurement, and by calculating a mean value of time differences between corresponding zero-crossings.

Therefore, according to one mode of the clock skew measurement method of the present invention, timing jitters $\Delta\phi^j[n]$ and $\Delta\phi^k[n]$ of the respective two clock signals under measurement $x_j(t)$ and $x_k(t)$ shown in FIG. 6 are first obtained, and then a deterministic clock skew value $\tau_{Skew}^{j,k}$ between the two clock signals under measurement $x_j(t)$ and $x_k(t)$ is obtained. Next, a timing difference between clock edges is obtained by calculating a difference between the timing jitter sequences $\Delta\phi^j[n]$ and $\Delta\phi^k[n]$, and then the random component of the clock skew between the clock signals under measurement $x_j(t)$ and $x_k(t)$ is obtained. A clock skew $T_{Skew}^{j,k}[n]$ between the clock signals under measurement is obtained by obtaining a sum of the random component of the clock skew and the deterministic component $\tau_{Skew}^{j,k}$. An obtained clock skew $T_{Skew}^{j,k}[n]$ is shown in FIG. 7. If necessary, an RMS value and a peak-to-peak value of clock skew are obtained from the clock skew sequence $T_{Skew}^{j,k}[n]$. An RMS value $T_{skew,RMS}^{j,k}$ of clock skew is a standard deviation of the clock skew $T_{Skew}^{j,k}[n]$, and is obtained by the following equation.

$$T_{Skew,RMS}^{j,k} = \sqrt{\left(\frac{1}{N}\right)\sum_{n=1}^{N}\left(T_{Skew}^{j,k}[n] - T'_{Skew}^{j,k}\right)^2} \text{ [sec]} \quad (22)$$

In this case, N is the number of samples of the measured clock skew data, and $T'_{Skew}^{j,k}$ is a mean value. In addition, a peak-to-peak value $T_{Skew,PP}^{j,k}$ of clock skew is a difference between the maximum value and the minimum value of the $T_{Skew}^{j,k}[n]$, and can be obtained by the following equation.

$$T_{Skew,PP}^{j,k} = \max_n(T_{Skew}^{j,k}[k]) - \min_n(T_{Skew}^{j,k}[k]) \text{ [sec]} \quad (23)$$

FIG. 8 shows a histogram of clock skew measured by this clock skew measurement method.

According to another aspect of the clock skew measurement method of the present invention, a clock skew between clock signals each having a different frequency from one another can also be measured. Now, in a clock distribution network shown in FIG. 9, a system clock signal $CLK_G$ from an external system clock source 14 is inputted to a clock signal source 11 comprised of a PLL (Phase Locked Loop) circuit, where its frequency is multiplied by M. A clock signal $CLK_g$ whose frequency is M multiple of that of the $CLK_G$ is distributed as the clock signals $CLK_j$ and $CLK_k$ to a network, for example, the registers 12*j* and 12*k*. FIG. 10*a* shows the system clock signal $CLK_G$, FIG. 10*b* shows an ideal clock signal that is created by multiplying the frequency of the $CLK_G$ by M, and FIG. 10*c* shows the distributed clock signal $CLK_j$ that is created by multiplying the frequency of the $CLK_G$ by M. $\Delta\Theta[1]$ [rad] of the system clock signal $CLK_G$ represents a timing fluctuation of its edge from an ideal clock edge. Therefore, the clock shown in FIG. 10*b* that is created by multiplying the frequency of the system clock signal $CLK_G$ shown in FIG. 10*a* by M is, as shown in FIG. 10*b*, a clock of a case in which the system clock signal $CLK_G$ is multiplied by 2 in the case of illustrated example. Therefore, the number of clock edges is doubled in the case of FIG. 10*b*. In this case, it is sufficient for a rising edge of a newly increased clock to assign the jitter $\Delta\Theta[1]$ of a rising edge of the original system clock. In the case where the frequency is multiplied by M, one to one relationship of $\Delta\Theta[\lfloor n/M \rfloor]$ and $\Delta\phi^j[n]$ can be obtained when the $\Delta\Theta[1]$ is assigned (M−1) times. In this case, $\lfloor x \rfloor$ represents the maximum integer that does not exceed x. When a clock skew between the clock signals $CLK_j$ and $CLK_G$ is obtained using the equation (6), an equation (24) is obtained.

$$T_{Skew}^{G,j}[n] = \tau_{Skew}^{G,j} + \left[\Delta\phi^j[n]\left(\frac{T_j}{2\pi}\right) - \Delta\Theta\left\lfloor\frac{n}{M}\right\rfloor\left(\frac{T_G}{2\pi}\right)\right] \text{ [sec]} \quad (24)$$

A deterministic clock skew value $\tau_{Skew}^{G,j}$ between the clock signals $CLK_j$ and $CLK_G$ is expressed by a time difference between an ideal clock edge $(nMT)_j$ of the clock signal $CLK_j$ and an ideal clock edge $(nMT)_G$ of the system clock signal $CLK_G$, and can be obtained by the following equation from the initial phase angles of the respective clock signals.

$$\tau_{Skew}^{G,j} = (nMT)_j - (nMT)_G \qquad (25)$$

$$= \phi_0^G\left(\frac{T_G}{2\pi}\right) - \phi_0^j\left(\frac{T_j}{2\pi}\right) = \phi_0^G\left(\frac{MT_0}{2\pi}\right) - \phi_0^j\left(\frac{T_0}{2\pi}\right) \text{ [sec]}$$

In this case, since the clock signal $CLK_j$ is a clock signal that is created by multiplying the frequency of the system clock signal $CLK_G$ by M, a fundamental period $T_G$ of the clock signal $CLK_G$ is equal to M times of a fundamental period $T_j$ of the clock $CLK_j$ ($T_G = MT_j$).

In addition, according to further another aspect of the clock skew measurement method of the present invention, a clock skew between the clock signals $CLK_j$ and $CLK_k$ can be measured, using an apparatus that can simultaneously measure two channels, by simultaneously sampling only the clock signals $CLK_j$ and $CLK_k$ at first, and then by simultaneously sampling only the clock signals $CLK_k$ and $CLK_g$.

That is, only the clock signals $CLK_j$ and $CLK_g$ are simultaneously sampled at first, and then a clock skew between the clock signals $CLK_j$ and $CLK_g$ is obtained by the following equation (26) using the second term in the right side of the first equation in the equation (6).

$$T_{Skew}^{g,j}[n] = \tau_{Skew}^{g,j} + \left[\Delta\phi^j[n]\left(\frac{T_j}{2\pi}\right) - \Delta\phi^g[n]\left(\frac{T_g}{2\pi}\right)\right] \text{ [sec]} \qquad (26)$$

Next, only the clock signals $CLK_k$ and $CLK_g$ are simultaneously sampled at first, and then a clock skew between the clock signals $CLK_k$ and $CLK_g$ is similarly obtained by the following equation (27)

$$T_{Skew}^{g,k}[n] = \tau_{Skew}^{g,k} + \left[\Delta\phi^k[n]\left(\frac{T_k}{2\pi}\right) - \Delta\phi^g[n]\left(\frac{T_g}{2\pi}\right)\right] \text{ [sec]} \qquad (27)$$

Finally, a difference between the clock skew sequences $T_{Skew}^{g,j}$ and $T_{Skew}^{g,k}$ obtained by the equations (26) and (27), respectively is calculated to estimate a clock skew between the clock signals $CLK_j$ and $CLK_k$ using the following equation (28).

$$T_{Skew}^{j,k}[n] = T_{Skew}^{g,k}[n] - T_{Skew}^{g,j}[n] \qquad (28)$$

$$= \left\{\tau_{Skew}^{g,k} + \left[\Delta\phi^k[n]\left(\frac{T_k}{2\pi}\right) - \Delta\phi^g[n]\left(\frac{T_g}{2\pi}\right)\right]\right\} -$$

$$\left\{\tau_{Skew}^{g,j} + \left[\Delta\phi^j[n]\left(\frac{T_j}{2\pi}\right) - \Delta\phi^g[n]\left(\frac{T_g}{2\pi}\right)\right]\right\}$$

$$= (\tau_{Skew}^{g,k} - \tau_{Skew}^{g,j}) + \left\{\left[\Delta\phi^k[n]\left(\frac{T_k}{2\pi}\right) - \Delta\phi^g[n]\left(\frac{T_g}{2\pi}\right)\right] - \right.$$

$$\left.\left[\Delta\phi^j[n]\left(\frac{T_j}{2\pi}\right) - \Delta\phi^g[n]\left(\frac{T_g}{2\pi}\right)\right]\right\} \text{ [sec]}$$

As a result, when clock skews among N clock signals are measured, the required number of simultaneous samplings is decreased to (N−1) two-channel simultaneous measurements from $_NC_2$ (=N(N−1)/2). In addition, this method requires only the minimum number of pins when distributed clock signals on a semiconductor chip, for example, are taken out to the outside of the chip. Therefore, this method is optimum for an evaluation test of a VLSI. In addition, the above procedure can be also applied to clock signals each having different frequency from one another.

The clock skew measurement method according to the present invention can be used not only for the estimation of a clock skew between distributed clocks in a microprocessor unit as described above, but can also be applied to the estimation of a clock skew of other signals.

Timing Jitter Estimation Method

Next, a timing jitter estimation method used in the clock skew measurement method according to the present invention will be explained.

A jitter-free clock signal is a square wave having a fundamental frequency $f_0$. This signal can be decomposed by Fourier analysis to harmonics having frequencies $f_0$, $3f_0$, $5f_0$, . . . . Since a jitter corresponds to a fluctuation of a fundamental frequency of a clock signal under measurement, only signal components around the fundamental frequency are handled in the jitter analysis.

A fundamental component of a jittery clock signal (clock signal under measurement) can be expressed as a sinusoidal wave, assuming that its amplitude is A and its fundamental period is $T_0$, by the following equation.

$$x(t) = A\cos(\phi(t)) = A\cos\left(\left(\frac{2\pi}{T_0}\right)t + \phi_0 - \Delta\phi(t)\right) \qquad (29)$$

Here, $\phi(t)$ is an instantaneous phase of the clock signal under measurement, and can be expressed by a sum of a linear instantaneous phase component $2\pi/T_0$ containing the fundamental period $T_0$, an initial phase angle $\phi_0$ (can be made zero in the calculation), and an instantaneous phase noise component $\Delta\phi(t)$.

When the instantaneous phase noise component $\Delta\phi(t)$ is zero, an interval between rising zero-crossing points of the clock signal under measurement is a constant period $T_0$. The non-zero $\Delta\phi(t)$ fluctuates the zero-crossing points of the clock signal under measurement. That is, a $\Delta\phi(nT_0)$ at a zero-crossing point $nT_0$ represents a time fluctuation of a zero-crossing point, and is called a jitter. Therefore, an instantaneous phase noise $\Delta\phi(t)$, at zero-crossing points, a timing jitter of the clock signal under measurement can be obtained, by estimating an instantaneous phase $\phi(t)$ of the clock signal under measurement, and by obtaining a difference between an instantaneous phase and a linear phase (corresponds to a phase waveform of a jitter-free ideal clock signal) $2\pi t/T_0 + \phi_0$.

In the timing jitter estimation method used in the present invention, for example, a clock signal under measurement x(t) is transformed into a complex analytic signal z(t) at first, and an instantaneous phase $\phi(t)$ of the clock signal under measurement x(t) is estimated from the analytic signal z(t). A linear line fitting by least squares method is applied to the estimated instantaneous phase waveform data to obtain a linear instantaneous phase $\phi_{linear}(t)$ corresponding to an instantaneous phase waveform of a jitter-free ideal signal. Then a difference between the instantaneous phase and the linear instantaneous phase $\phi_{linear}(t)$ is calculated to obtain an instantaneous phase noise $\Delta\phi(t)$ of the clock signal under measurement. The instantaneous phase noise waveform $\Delta\phi(t)$ is sampled at timings (approximated zero-crossing points) closest to each zero-crossing point of a real part x(t) of the analytic signal z(t) to estimate an instantaneous phase noise at a zero-crossing timing $nT_0$, i.e., a timing jitter $\Delta\phi[n](=\Delta\phi(nT_0))$. The method of obtaining, in this manner, an instantaneous phase noise $\Delta\phi(t)$ to estimate a timing jitter $\Delta\phi[n]$ was proposed by the inventors of the present invention, and is described in, for example, "Extraction of Peak-to-Peak and RMS Sinusoidal Jitter Using an Analytic Signal Method" by T. J. Yamaguchi, M. Soma, M. Ishida, T. Watanabe, and T. Ohmi, Proceedings of 18th IEEE VLSI Test Symposium, pp. 395-402, 2000.

In this timing jitter estimation method, a timing jitter can be estimated with high accuracy by removing, using waveform clipping means, amplitude modulation (AM) components of the clock signal under measurement in the state that phase modulation components corresponding to jitter of the clock signal under measurement are kept in the clock signal under measurement. In addition, it is desirable to remove low frequency components of the instantaneous phase noise using low frequency component removing means.

Instantaneous Phase Estimation Method using Analytic Signal

An analytic signal $z(t)$ of a clock signal under measurement $x(t)$ is defined by a complex signal expressed by the following equation (30).

$$z(t) = x(t) + j\hat{x}(t) \quad (30)$$

In this case, j represents an imaginary unit, and an imaginary part $\hat{x}(t)$ of the complex signal $z(t)$ is a Hilbert transform of a real part $x(t)$.

On the other hand, Hilbert transform of a time waveform $x(t)$ is defined by the following equation (31).

$$\hat{x}(t) = H[x(t)] = \frac{1}{\pi}\int_{-\infty}^{+\infty}\frac{x(\tau)}{t-\tau}dt \quad (31)$$

In this case, $\hat{x}(t)$ is a convolution of the function $x(t)$ and $(1/\pi f)$. That is, Hilbert transform is equivalent to an output at the time when the $x(t)$ is passed through a all pass filter. However, the output $\hat{x}(t)$ in this case has not been changed in terms of its spectrum components, but its phase has been shifted by $\pi/2$.

Analytic signal and Hilbert transform are described in, for example, "Probability, Random Variables, and Stochastic Processes" by A. Papoulis, 2nd edition, McGraw-Hill Book Company, 1984.

An instantaneous phase waveform $\phi(t)$ of a clock signal under measurement $x(t)$ can be obtained from an analytic signal $z(t)$ using the following equation (32).

$$\phi(t) = \tan^{-1}\left[\frac{\hat{x}(t)}{x(t)}\right] \quad (32)$$

Next, an algorithm for estimating an instantaneous phase using Hilbert transform will be described. First, Hilbert transform is applied to a clock signal under measurement $x(t)$.

$$x(t) = A\cos\left(\left(\frac{2\pi}{T_0}\right)t + \phi_0 - \Delta\phi(t)\right) \quad (33)$$

Then a signal $\hat{x}(t)$ corresponding to an imaginary part of an analytic signal $z(t)$ is obtained as follows.

$$\hat{x}(t) = H[x(t)] = A\sin\left(\left(\frac{2\pi}{T_0}\right)t + \phi_0 - \Delta\phi(t)\right) \quad (34)$$

Then the clock signal under measurement $x(t)$ is transformed into an analytic signal $z(t)$ as follows.

$$z(t) = x(t) + j\hat{x}(t) = \quad (35)$$
$$A\cos\left(\left(\frac{2\pi}{T_0}\right)t + \phi_0 - \Delta\phi(t)\right) + jA\sin\left(\left(\frac{2\pi}{T_0}\right)t + \phi_0 - \Delta\phi(t)\right)$$

Here, a band-pass filtering process has been applied to the obtained analytic signal. This is because a jitter corresponds to a fluctuation of a fundamental frequency of a clock signal under measurement and hence only signal components around the fundamental frequency are processed in a jitter analysis. Next, a phase function $\phi(t)$ is estimated from the obtained analytic signal $z(t)$ using the equation (32).

$$\phi(t) = \left[\frac{2\pi}{T_0}t + \phi_0 - \Delta\phi(t)\right]\mathrm{mod}2\pi \text{ [rad]} \quad (36)$$

Here, the $\phi(t)$ is expressed using principal values of phase in the range of $-\pi$ to $+\pi$, and has a discontinuity point at the proximity of a point where the phase changes from $+\pi$ to $-\pi$. Finally, by unwrapping (that is, integer multiples of $2\pi$ are appropriately added to principal values $\phi(t)$) the discontinuous phase function $\phi(t)$, a continuous instantaneous phase function $\phi(t)$, from which discontinuity has been removed, can be obtained.

$$\phi(t) = \left(\frac{2\pi}{T_0}\right)t + \phi_0 - \Delta\phi(t) \text{ [rad]} \quad (37)$$

A phase unwrapping method is described in "The Cephstrum: A Guide to Processing" by Donald G. Childers, David P. Skinner, and Robert C. Kemerait, Proceedings of IEEE, vol. 65, pp. 1482-1442, 1977.

Tranformation To Analytic Signal using Fast Fourier Transform

A transformation from a clock signal under measurement to an analytic signal can be realized by a digital signal processing using a transformation of a signal in time domain into a signal in frequency domain like Fast Fourier Transformation (FFT).

First, FFT is applied to a digitized clock signal under measurement $x(t)$ shown in FIG. 11 to obtain a both-sided spectrum (having positive and negative frequencies) $X(f)$. FIG. 12A shows the obtained both-sided spectrum $X(f)$. Next, as shown in FIG. 12B, only data around the fundamental frequency in the positive frequency components of the spectrum $X(f)$ are retained, and the remaining data are replaced by zeros. In addition, the positive frequency components are doubled. These processes in frequency domain correspond to limiting bandwidth of the clock signal under measurement and transforming the clock signal under measurement into an analytic signal Z(f) in time domain. Finally, by applying inverse FFT to the band-limited signal Z(f), a band-limited analytic signal z(t) can be obtained.

Transformation to an analytic signal using FFT is described in, for example, "Random Data: Analysis and Measurement Procedure" by J. S. Bendat and A. G. Piersol, 2nd edition, John Wiley & Sons, Inc., 1986.

In addition, when an estimation of instantaneous phase is the object of the process, the process of doubling the positive frequency components can be omitted.

Approximated Zero-Crossing Point Detection Method

Next, an approximated zero-crossing point detection method will be described. First of all, the maximum value of a real part x(t) of an analytic signal of the inputted clock signal under measurement is defined as 100% level, and the minimum value is defined as 0% level to calculate 50% level signal value $V_{50}\%$ as a zero crossing level. A difference between a sample value and the 50% level $V_{50}\%$ and a difference between its adjacent sample value and the 50% level $V_{50}\%$ of the x(t), i.e., $(x(j-1)-V_{50}\%)$ and $(x(j)-V_{50}\%)$ are calculated, and furthermore a product of those difference values $(x(j-1)-V_{50}\%) \times (x(j)-V_{50}\%)$ is calculated. When the x(t) crosses 50% level, i.e., zero-crossing level, the sign of its sample value $(x(j-1)-V_{50}\%)$ or $(x(j)-V_{50}\%)$ changes from a negative sign to a positive sign or from a positive sign to a negative sign. Therefore, when the product is negative, it is detected that the x(t) has passed the zero-crossing level, and a time point j−1 or j at which a smaller absolute value of the sample value $(x(j-1)-V_{50}\%)$ or $(x(j)-V_{50}\%)$ is detected is obtained as an approximated zero crossing point.

Waveform Clipping

Waveform clipping means removes AM components from an input signal and retains only PM components in the input signal. A waveform clipping is performed by: 1) multiplying an analog or digital input signal by a constant, 2) replacing a signal value greater than a predetermined threshold value Th1 with the threshold value Th1, and 3) replacing a signal value less than a predetermined threshold value Th2 with the threshold value Th2. Here, it is assumed that the threshold value Th1 is greater than the threshold value Th2.

DESCRIPTION OF THE EMBODIMENTS

Embodiments of the present invention are described below.

Figure 13:
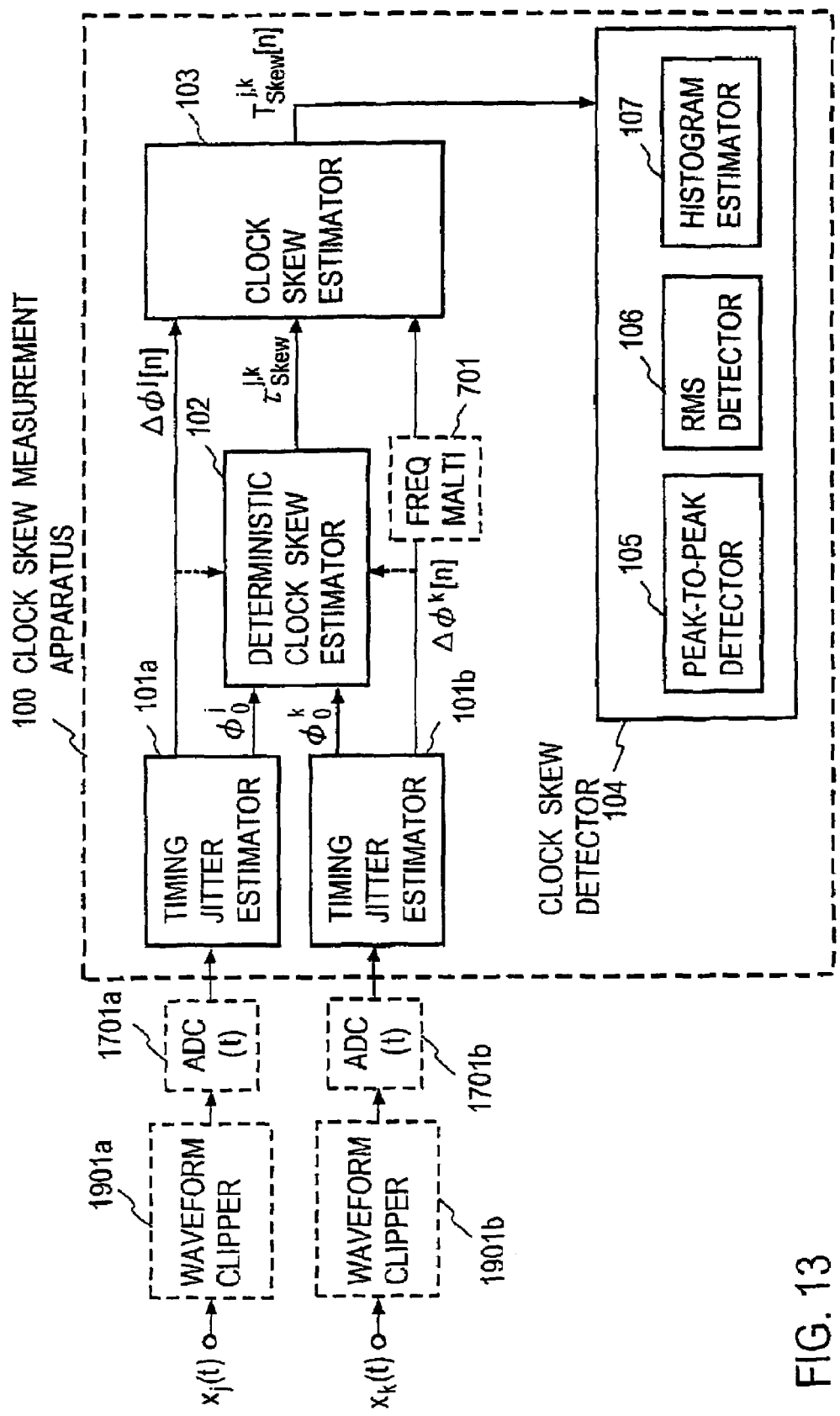
FIG. 13 is a block diagram showing a functional configuration of an embodiment of a clock skew measurement apparatus according to the present invention.

FIG. 13 shows a functional configuration of an embodiment of a clock skew measurement apparatus according to the present invention. This clock skew measurement apparatus 100 comprises timing jitter estimators 101a and 101b for estimating timing jitter sequences $\Delta\phi^j[n]$ and $\Delta\phi^k[n]$ of clock signals under measurement $x_j(t)$ and $x_k(t)$, respectively, a deterministic clock skew estimator 102 for estimating a timing error between ideal clock edges of the respective clock signals under measurement and for estimating a deterministic component $\tau_{Skew}^{j,k}$ of clock skew, a clock skew estimator 103 to which the timing jitter sequences $\Delta\phi^j[n]$ and $\Delta\phi^k[n]$ are inputted for calculating a timing difference sequence between those timing jitter sequences $\Delta\phi^j[n]$ and $\Delta\phi^k[n]$ to output a clock skew sequence $T_{Skew}^{j,k}[n]$, and a clock skew detector 104 for obtaining clock skew values between the clock signals under measurement from the clock skew sequence. In addition, the clock skew detector 104 comprises a peak-to-peak detector 105 for obtaining a difference between the maximum value and the minimum value of the clock skew sequence $T_{Skew}^{j,k}[n]$, an RMS detector 106 for calculating an RMS value as a standard deviation of the clock skew sequence, and a histogram estimator 107 for obtaining a histogram of the clock skew sequence. The timing jitter estimators 101a and 101b estimate initial phase angles $\phi_0^j$ and $\phi_0^k$ of the clock signals under measurement $x_j(t)$ and $x_k(t)$, respectively in addition to the timing jitter sequences $\Delta\phi^j[n]$ and $\Delta\phi^k[n]$, and output the estimated initial phase angles to the deterministic clock skew estimator 102. A specific configuration of the timing jitter estimators 101a and 101b will be described later.

Figure 14:
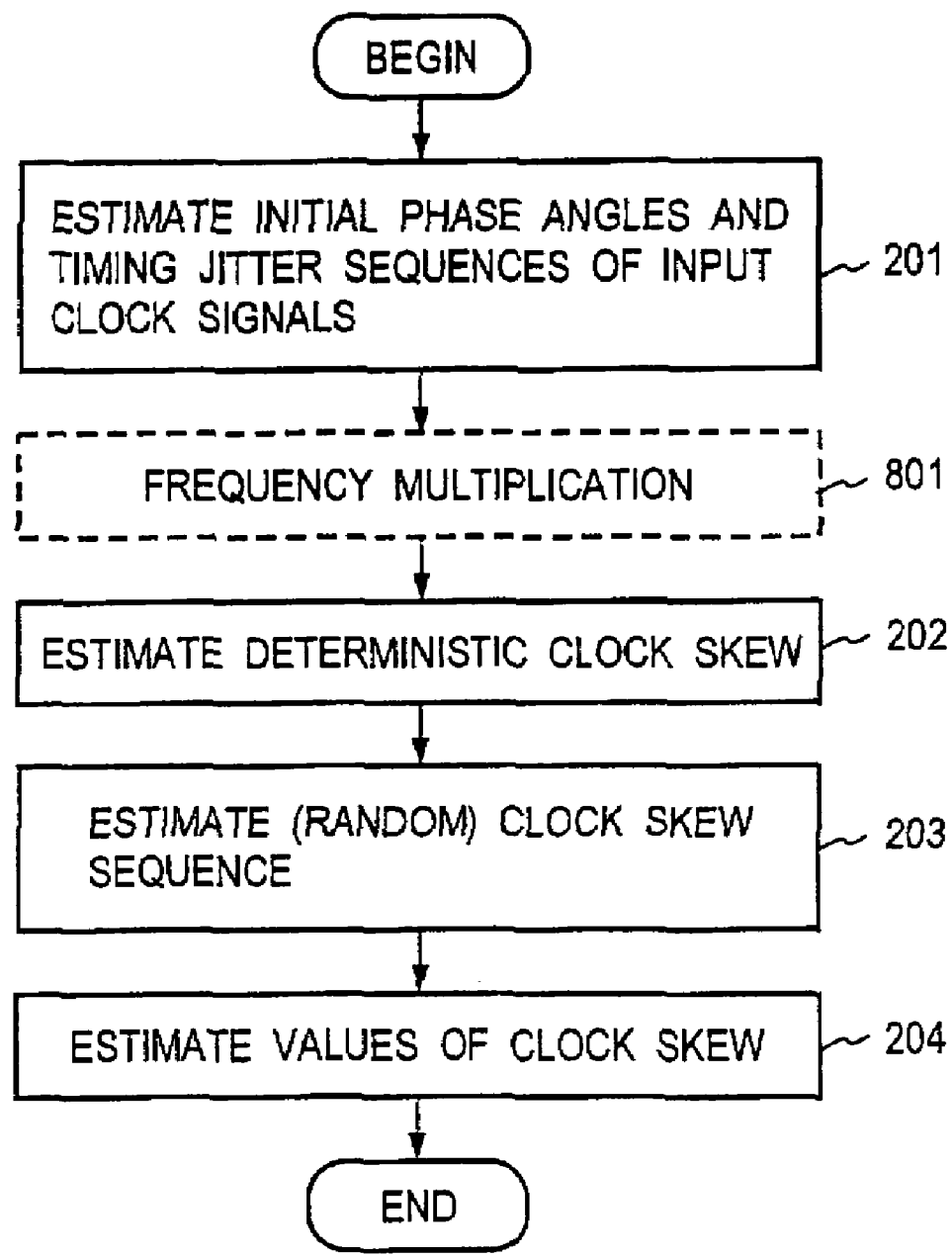
FIG. 14 is a flow-chart showing an embodiment of a clock skew measurement method according to the present invention.

Next, the operation in the case where a clock skew between the clock signals under measurement $x_j(t)$ and $x_k(t)$ is measured using the clock skew measurement apparatus 100 of this embodiment will be described. FIG. 14 shows a processing procedure of the embodiment of the clock skew measurement method according to the present invention. First, in step 201, initial phase angles $\phi_0^j$ and $\phi_0^k$, and timing jitter sequences $\Delta\phi[n]$ and $\Delta\phi^k[n]$ of the respective clock signals under measurement $x_j(t)$ and $x_k(t)$ are estimated by the timing jitter estimators 101a and 101 b, respectively. Next, in step 202, a difference between the initial phase angles $\phi_0^j$ and $\phi_0^k$ of the respective clock signals under measurement is calculated by the deterministic clock skew estimator 102 to estimate a deterministic component $\tau_{Skew}^{j,k}$ of clock skew between the clock signals under measurement. Next, in step 203, a clock skew sequence $T_{Skew}^{j,k}[n]$ between the clock signals under measurement $x_j(t)$ and $x_k(t)$ is estimated by the clock skew estimator 103 from the timing jitter sequences $\Delta\phi^j[n]$ and $\Delta\phi^k[n]$, and the deterministic component $\tau_{Skew}^{j,k}$ of clock skew. Finally, in step 204, a clock skew value between the clock signals under measurement $x_j(t)$ and $x_k(t)$ is obtained by the clock skew detector 104 from the estimated clock skew sequence $T_{skew}^{j,k}$, and the process ends.

In the step 202 for estimating a deterministic component of clock skew between the clock signals under measurement, the deterministic clock skew estimator 102 obtains a deterministic component of clock skew between the clock signals under measurement using the equation (16). In addition, in the step 202, the deterministic clock skew estimator 102 may obtain, if necessary, an absolute value of the equation (16). In addition, in the step 203 for estimating a clock skew sequence between the clock signals under measurement, the clock skew estimator 103 obtains a clock skew sequence $T_{Skew}^{j,k}[n]$ between the clock signals under measurement using the equation (6). In the step 204 for obtaining a clock skew value between the clock signals under measurement, the peak-to-peak detector 105 obtains a peak-to-peak value of clock skew using the equation (23), the RMS detector 106 obtains an RMS value of clock skew using the equation (22), and the histogram estimator 107 obtains a histogram from the clock skew sequence. Alternatively, an RMS value and/or the peak-to-peak value may be obtained from only the second term of the equation (6). In addition, the step 201 for estimating initial phase angles and timing jitter sequences of the clock signals under measurement may be replaced by the processing procedure shown in FIG. 20. Furthermore, the step 202 for estimating a deterministic component of clock skew between the clock signals under measurement may be replaced by the processing procedure shown in FIG. 16.

The clock skew measurement apparatus shown in FIG. 13 can also be modified as an apparatus for estimating only random component of clock skew. In this case, the deterministic clock skew estimator 102 for obtaining a deterministic component of clock skew is omitted. Similarly, the clock skew measurement method shown in FIG. 14 can also be modified as a method of estimating only random component of clock skew. In this case, the step 202 for estimating a deterministic component of clock skew from initial phase angles of the clock signals under measurement is omitted.

Figure 15:
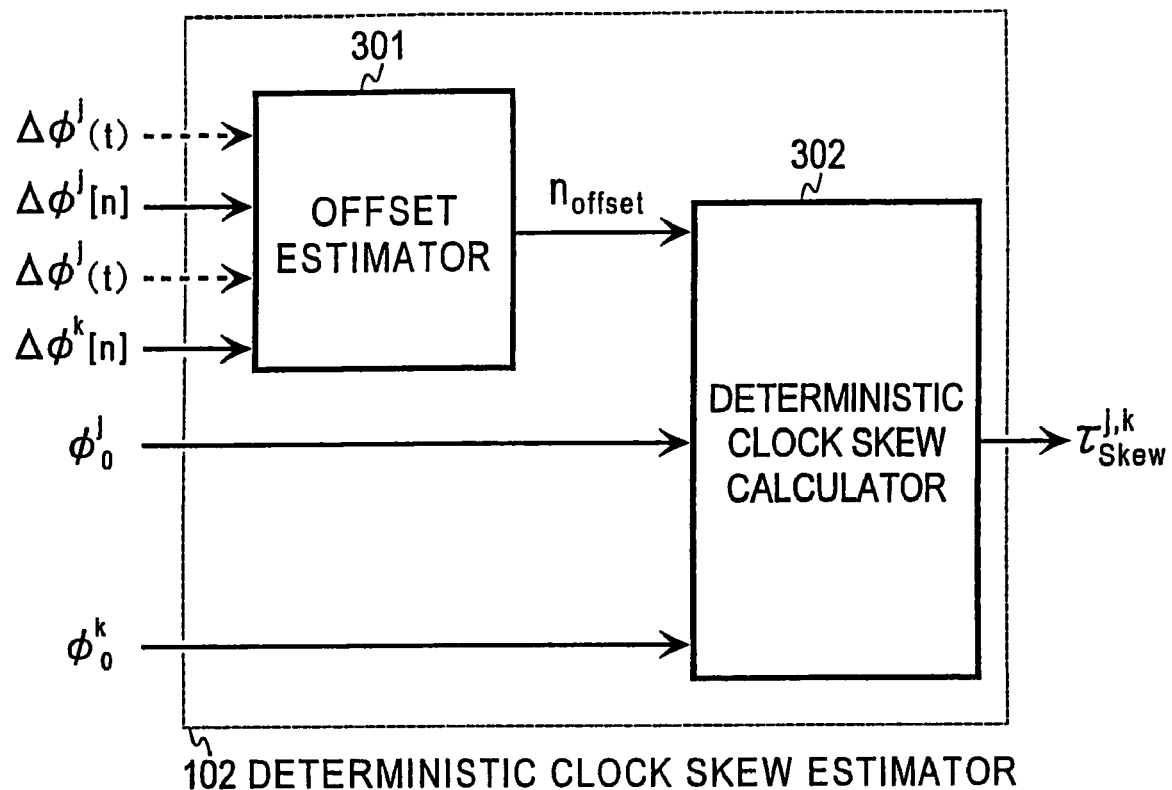
FIG. 15 is a block diagram showing a functional configuration of a specific example of a deterministic clock skew estimator 102 shown in FIG. 13.

The deterministic clock skew estimator 102 shown in FIG. 13 estimates a deterministic component of clock skew from a difference between initial phase angles $\phi_0^j$ and $\phi_0^k$ of the respective clock signals under measurement. However, the deterministic clock skew estimator can also be materialized by the configuration shown in FIG. 15. That is, this deterministic clock skew estimator 102 to which initial phase angles $\phi_0^j$ and $\phi_0^k$ and timing jitter sequences $\Delta\phi^j[n]$ and $\Delta\phi^k[n]$ of the respective clock signals under measurement $x_j(t)$ and $x_k(t)$ are inputted comprises an offset estimator 301 for estimating an offset $n_{offset}$ between corresponding clock edges of the respective clock signals under measurement from those timing jitter sequences $\Delta\phi^j[n]$ and $\Delta\phi^k[n]$, and a deterministic clock skew calculator 302 for calculating a deterministic component $\tau_{Skew}^{j,k}$ of clock skew between the clock signals under measurement from the initial phase angles $\phi_0^j$ and $\phi_0^k$ and the offset $n_{offset}$ between the corresponding clock edges estimated by the offset estimator 301.

Figure 16:
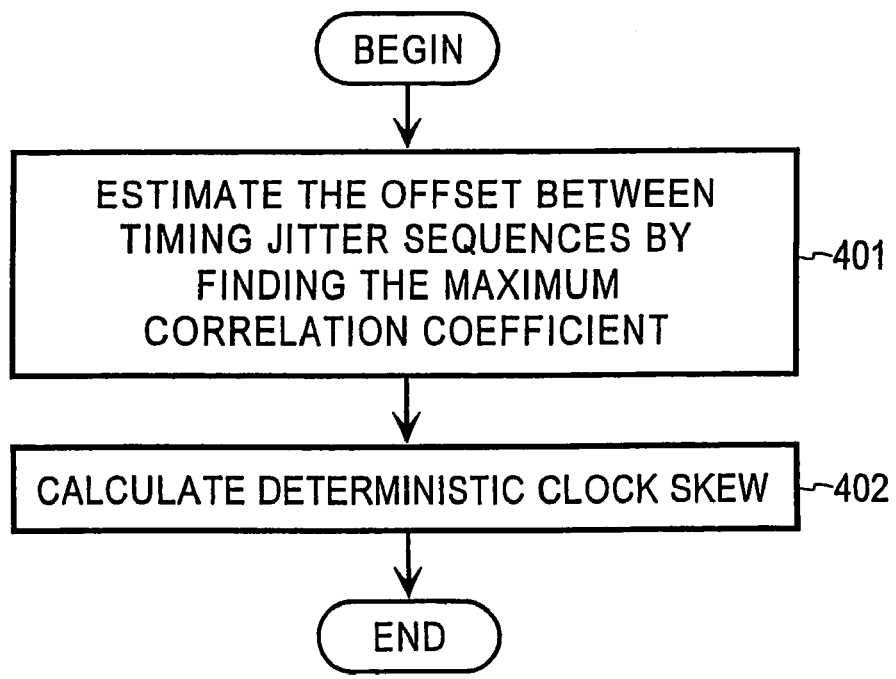
FIG. 16 is a flow-chart showing a processing example of a deterministic clock skew estimating step of the step 202 shown in FIG. 14.

The operation in the case where a deterministic component of clock skew between the clock signals under measurement is estimated using this deterministic clock skew estimator 102 will be described. FIG. 16 shows the processing procedure. First, in step 401, from the inputted timing jitter sequences $\Delta\phi^j[n]$ and $\Delta\phi^k[n]$ of the clock signals under measurement, an offset position, at which correlation function between those timing jitter sequences shows the largest value, is obtained by the offset estimator 301 to estimate an offset $n_{offset}$ between the corresponding clock edges. Next, in step 402, a deterministic component $\tau_{Skew}^{j,k}$ of clock skew between the clock signals under measurement $x_j(t)$ and $x_k(t)$ is calculated by the deterministic clock skew calculator 302 from the inputted initial phase angles $\phi_0^j$ and $\phi_0^k$ and the offset $n_{offset}$ between the corresponding clock edges, and then the process ends. In the step 402 for calculating a deterministic component of clock skew between the clock signals under measurement, the deterministic clock skew calculator 302 obtains a deterministic component of clock skew between the clock signals under measurement using the equation (21). As indicated by dashed lines in FIG. 15, instantaneous phase noises $\Delta\phi^j(t)$ and $\Delta\phi^k(t)$ to be explained in FIG. 19 may be inputted to the offset estimator 301 to obtain an offset position at which a correlative value between those $\Delta\phi^j(t)$ and $\Delta\phi^k(t)$ becomes the largest value for estimating an offset $n_{offset}$.

Figure 17:
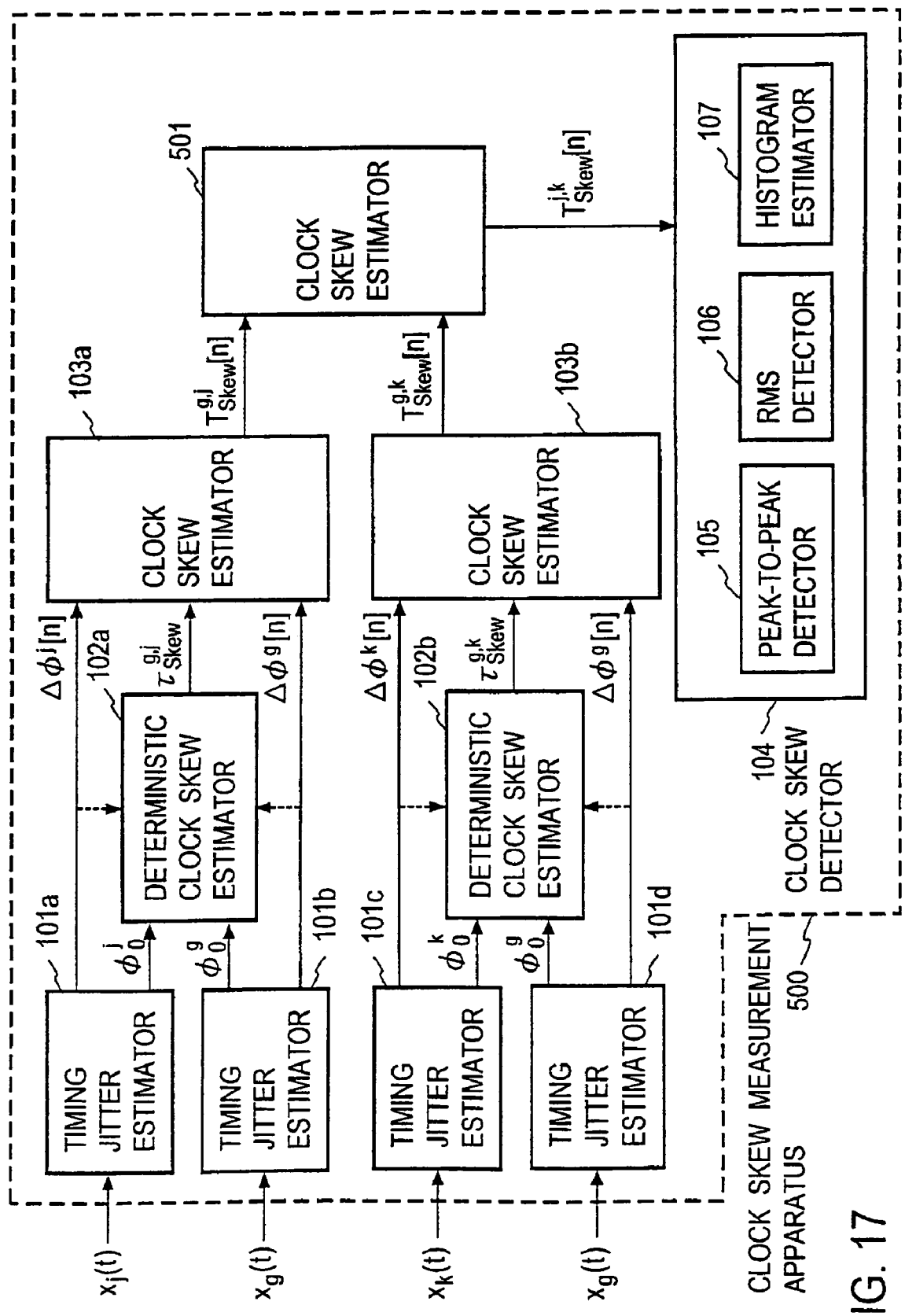
FIG. 17 is a block diagram showing a functional configuration of another embodiment of the clock skew measurement apparatus according to the present invention.

FIG. 17 shows a functional configuration of another embodiment of the clock skew measurement apparatus according to the present invention. This clock skew measurement apparatus 500 comprises timing jitter estimators 101a, 101b, 101c, and 101d for respectively estimating timing jitter sequences $\Delta\phi^j[n]$, $\Delta\phi^g[n]$, $\Delta\phi^k[n]$, and $\Delta\phi^g[n]$ of respective clock signals under measurement $x_j(t)$, $x_g(t)$, $x_k(t)$, and $x_g(t)$, deterministic clock skew estimators 102a and 102b for respectively estimating a timing error $E_t^{g,j}$ between ideal clock edges of the clock signals under measurement $x_j(t)$ and $x_g(t)$ and a timing error $E_t^{g,j}$ between ideal clock edges of the clock signals under measurement $x_k(t)$ and $x_g(t)$ to respectively estimate deterministic components $\tau_{Skew}^{g,j}$ and $\tau_{Skew}^{g,k}$ using those timing errors $E_t^{g,j}$ and $E_t^{g,k}$, clock skew estimators 103a and 103b to which the timing jitter sequences $\Delta\phi^j[n]$, $\Delta\phi^g[n]$, and $\Delta\phi^k[n]$, $\Delta\phi^g[n]$ are respectively inputted for calculating timing difference sequences between the two inputs at each clock skew estimator respectively to output clock skew sequences $T_{skew}^{g,j}[n]$ and $T_{skew}^{g,k}[n]$ respectively, a clock skew estimator 501 to which those clock skew sequences $T_{skew}^{g,j}[n]$ and $T_{skew}^{g,k}[n]$ are inputted for obtaining a difference between those clock skew sequences to estimate a clock skew sequence $T_{Skew}^{j,k}[n]$, and a clock skew detector 104 for obtaining a clock skew value between the clock signals under measurement from the clock skew sequence obtained by the clock skew estimator 501. For simplicity, the explanation of portions duplicated with those in FIG. 13 is omitted.

Figure 18:
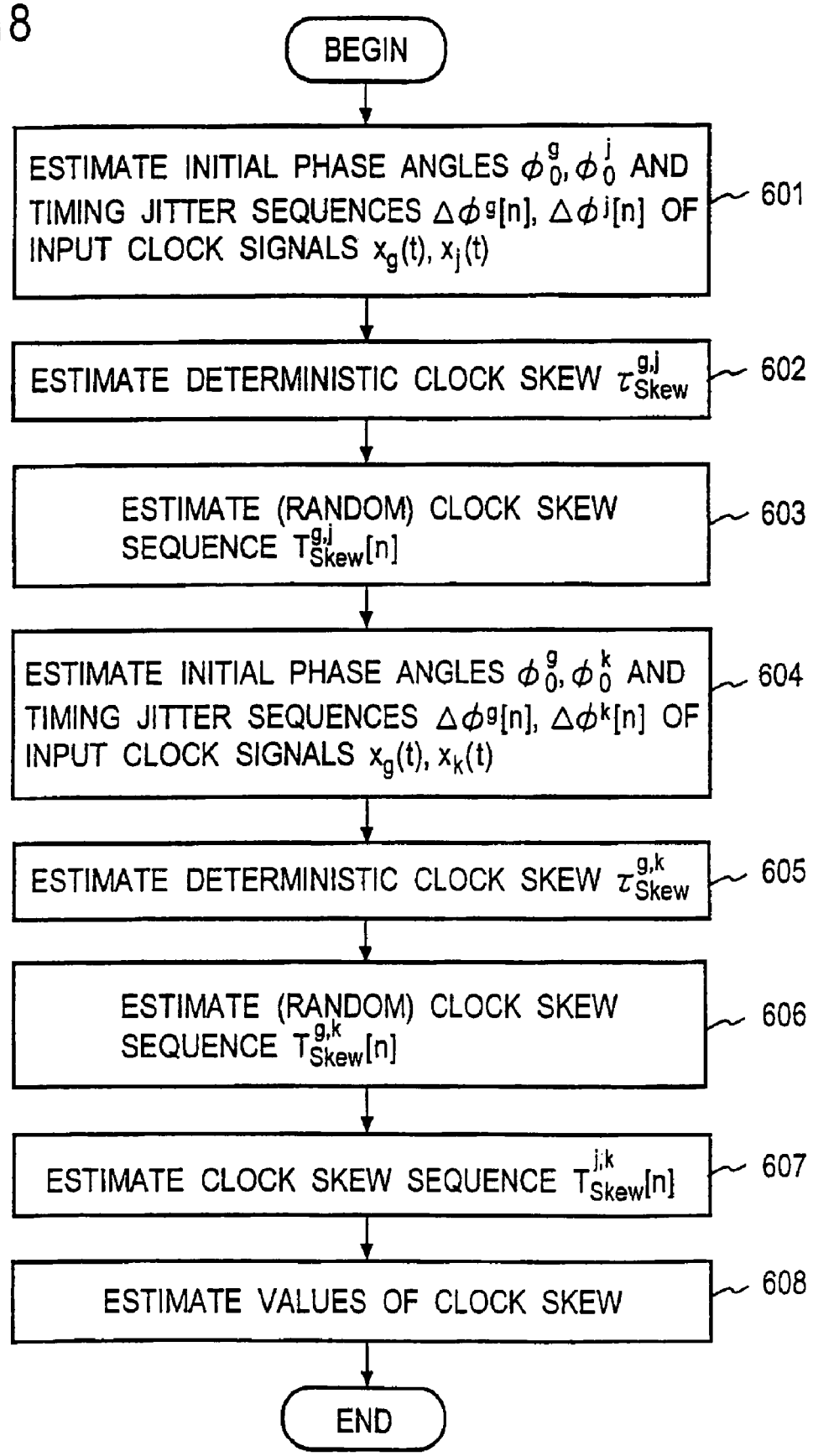
FIG. 18 is a flow-chart showing another embodiment of the clock skew measurement method according to the present invention.

Next, the operation in the case where a clock skew between the clock signals under measurement is measured using the clock skew measurement apparatus 500 according to the present invention will be described. FIG. 18 shows a processing procedure of the clock skew measurement method according to the present invention. First, in step 601, initial phase angles $\phi_0^j$ and $\phi_0^g$, and timing jitter sequences $\Delta\phi^j[n]$ and $\Delta\phi^g[n]$ of the respective clock signals under measurement $x_j(t)$ and $x_g(t)$ are estimated by the timing jitter estimators 101a and 101b, respectively. Next, in step 602, a difference between the initial phase angles $\phi_0^j$ and $\phi_0^g$ of the clock signals under measurement is calculated by the deterministic clock skew estimator 102a to estimate a deterministic component $\tau_{Skew}^{g,j}$ of clock skew between the clock signals under measurement. Next, in step 603, a clock skew sequence $T_{Skew}^{g,j}[n]$ between the clock signals under measurement is estimated by the clock skew estimator 103a from the timing jitter sequences $\Delta\phi^j[n]$ and $\Delta\phi^g[n]$, and the deterministic component $\tau_{Skew}^{g,j}$ of clock skew.

Next, in step 604, initial phase angles $\phi_0^k$ and $\phi_0^g$, and timing jitter sequences $\Delta\phi^k[n]$ and $\Delta\phi^g[n]$ of the respective clock signals under measurement $x_k(t)$ and $x_g(t)$ are estimated by the timing jitter estimators 101c and 101d, respectively. Next, in step 605, a difference between the initial phase angles $\phi_0^k$ and $\phi_0^g$ of the clock signal under measurement obtained in the step 604 is calculated by the deterministic clock skew estimator 102b to estimate a deterministic component $\tau_{Skew}^{g,k}$ of clock skew between the clock signals under measurement. Next, in step 606, a clock skew sequence $T_{Skew}^{g,k}[n]$ between the clock signals under measurement is estimated by the clock skew estimator 103b from the timing jitter sequences $\Delta\phi^k[n]$ and $\Delta\phi^g[n]$ obtained in the step 604 and the deterministic component $\tau_{skew}^{g,k}$ of clock skew obtained in the step 605. Next, in step 607, a clock skew sequence $T_{Skew}^{j,k}[n]$ between the clock signals under measurement $x_j(t)$ and $x_k(t)$ is estimated by the clock skew estimator 501 from the clock skew sequences $T_{Skew}^{g,j}[n]$ and $T_{Skew}^{g,k}[n]$ respectively obtained in the steps 603 and 606. Finally, in step 608, a clock skew value between the clock signals under measurement $x_j(t)$ and $x_k(t)$ is obtained by the clock skew detector 104 from the clock skew sequence $T_{Skew}^{j,k}[n]$ estimated in the step 607, and the process ends. In the step 607 for estimating the clock skew sequence between the clock signals under measurement $x_j(t)$ and $x_k(t)$, the clock skew estimator 501 obtains a clock skew sequence between the clock signals under measurement using the equation (28). The process sequence of the steps 601-603 and the steps 604-606 may be exchanged. For simplicity, the explanation of portions duplicated with those in FIG. 14 is omitted.

The clock skew measurement apparatus shown in FIG. 17 may also be configured as an apparatus for estimating only random component of clock skew. In this case, the deterministic clock skew estimators 102a and 102b for obtaining the deterministic components of clock skew are omitted. Similarly, the clock skew measurement method shown in FIG. 18 may also be modified as a method of estimating only random component of clock skew. In this case, the steps 602 and 605 for estimating deterministic components of clock skew from the initial phase angles of the clock signals under measurement are omitted.

Figure 1:
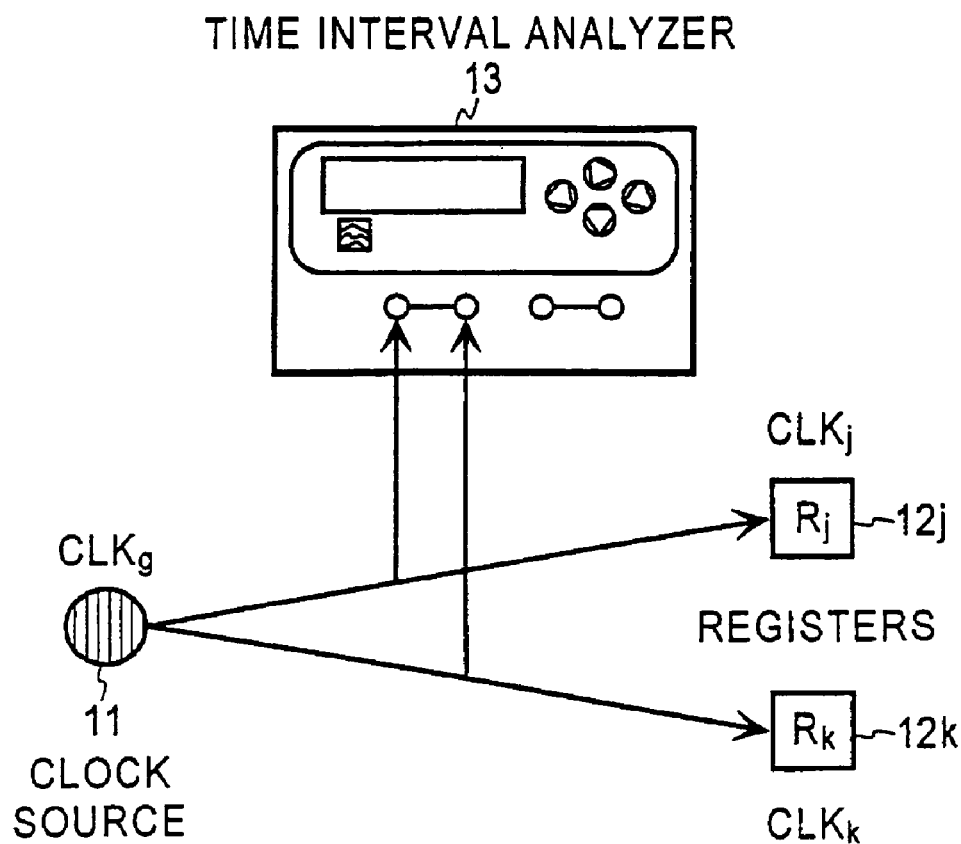
FIG. 1 is a diagram showing an example of a clock skew measurement using a time interval analyzer.
Figure 2:
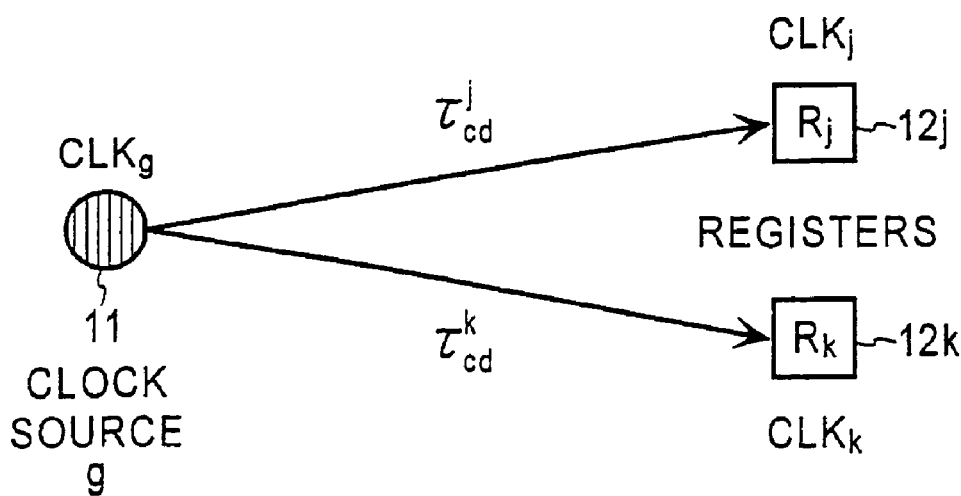
FIG. 2 is a diagram typically showing a clock distribution network.
Figure 3:
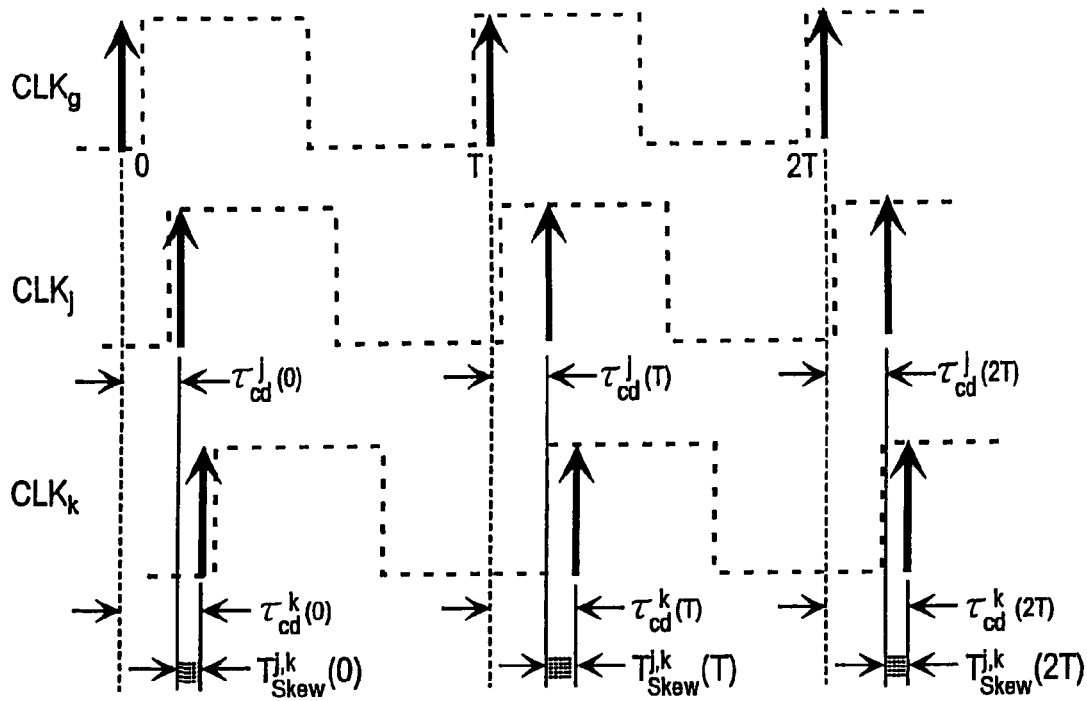
FIG. 3 is a diagram typically showing a timing of clock skew.
Figure 4:
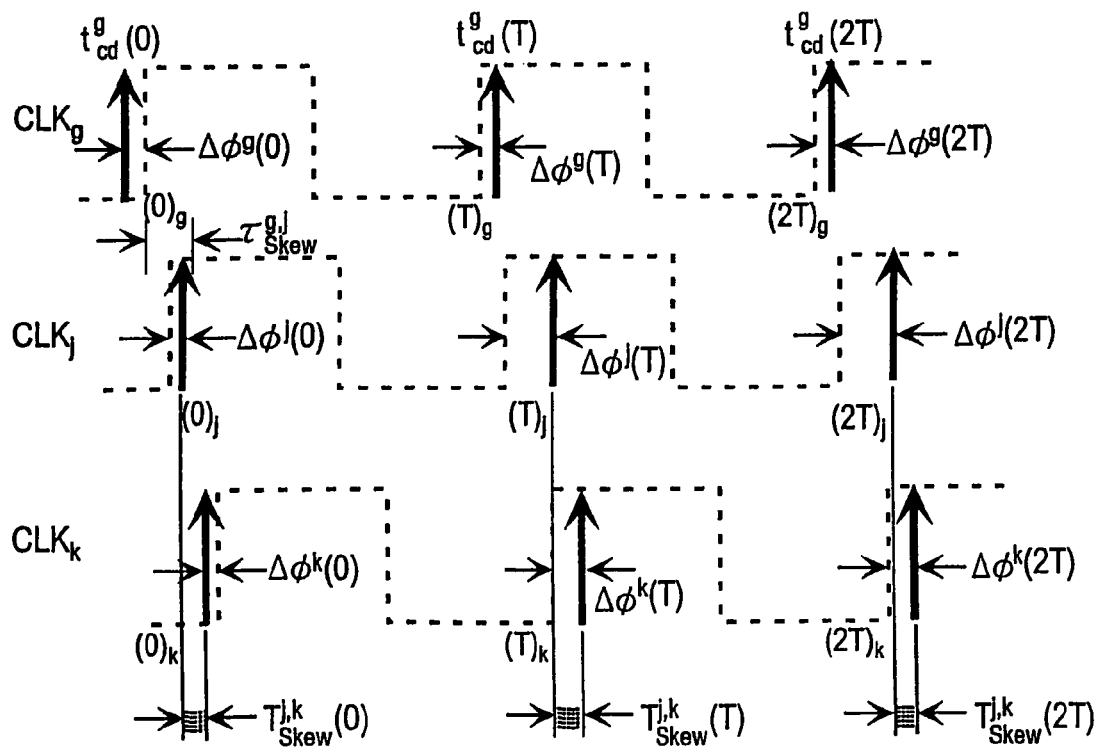
FIG. 4 is a diagram typically showing a relationship between a timing jitter and a clock skew.
Figure 5A:
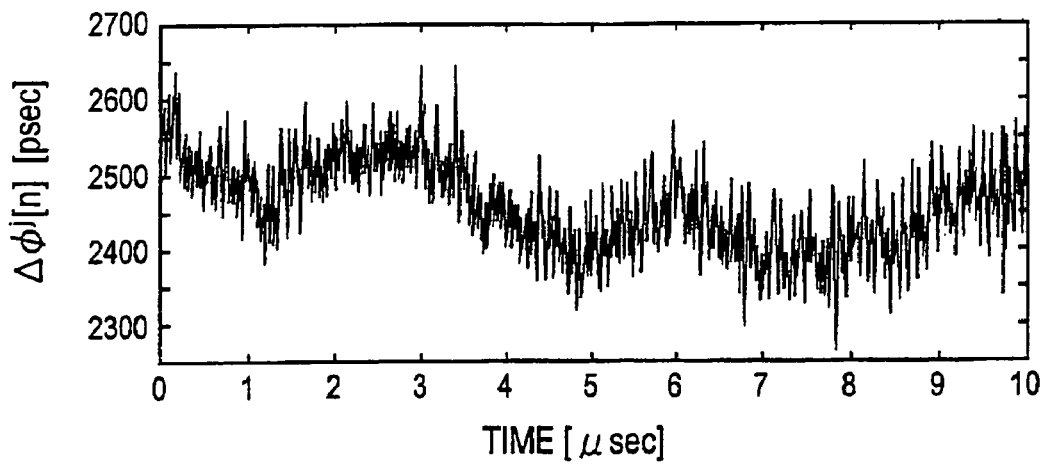
FIG. 5A is a diagram showing an example of a timing jitter $\Delta\phi^j[n]$ of a clock signal under measurement $x_j(t)$.
Figure 5B:
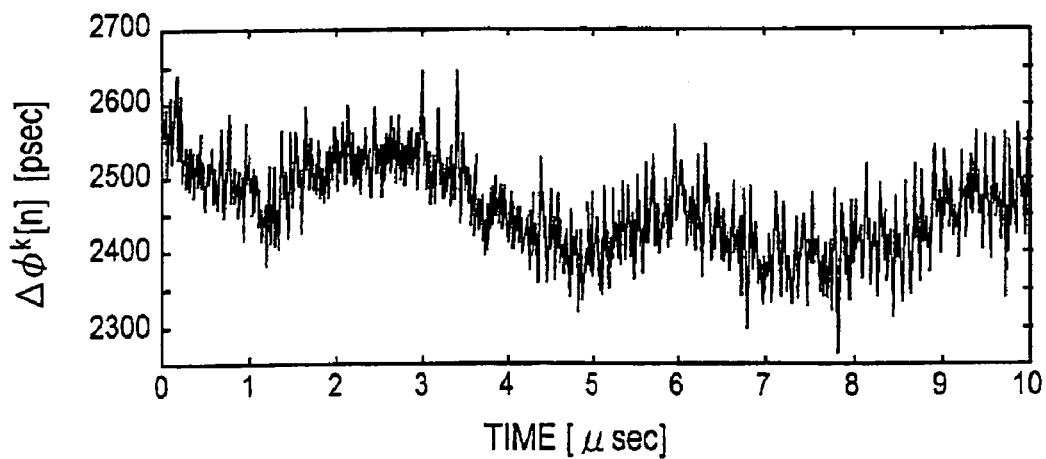
FIG. 5B is a diagram showing an example of a timing jitter $\Delta\phi^k[n]$ of a clock signal under measurement $x_k(t)$.
Figure 6:
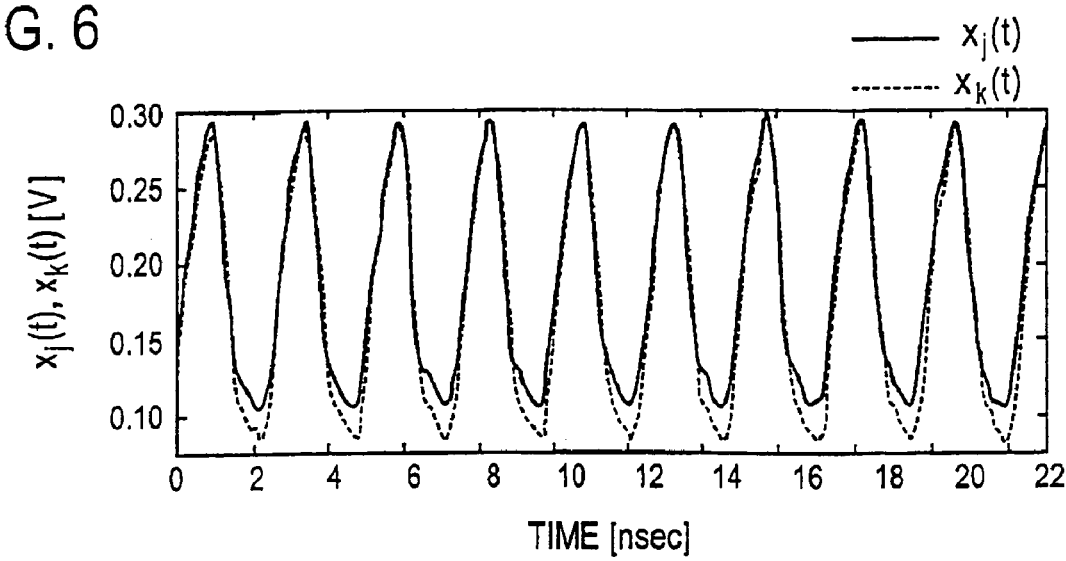
FIG. 6 is a diagram showing an example of a clock signal under measurement.
Figure 7:
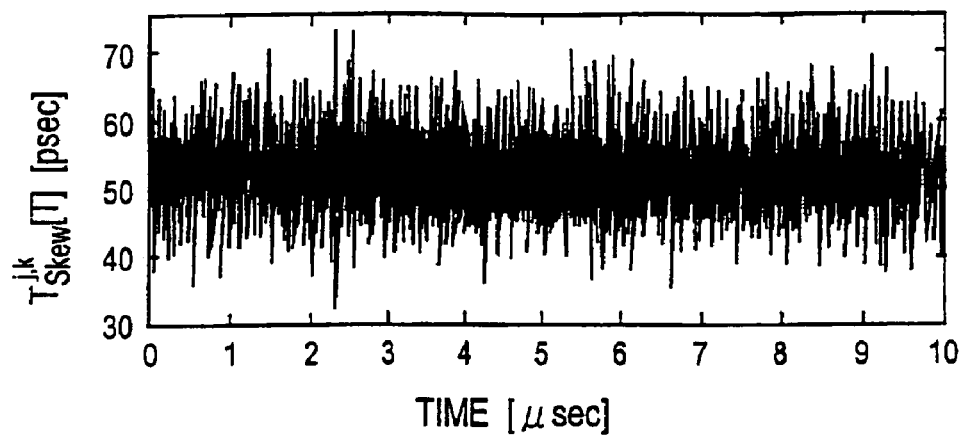
FIG. 7 is a diagram showing an example of a clock skew between clock signals under measurement measured by a clock skew measurement method according to the present invention.
Figure 8:
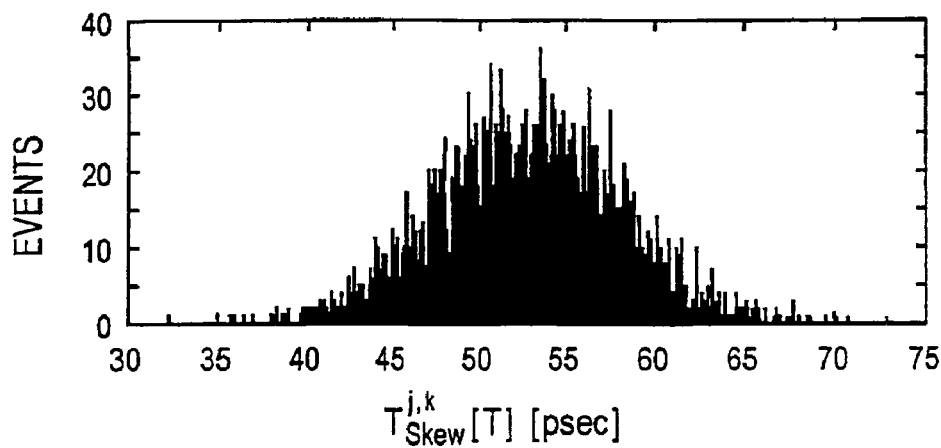
FIG. 8 is a diagram showing an example of a histogram of clock skew between clock signals under measurement measured by the clock skew measurement method according to the present invention.
Figure 9:
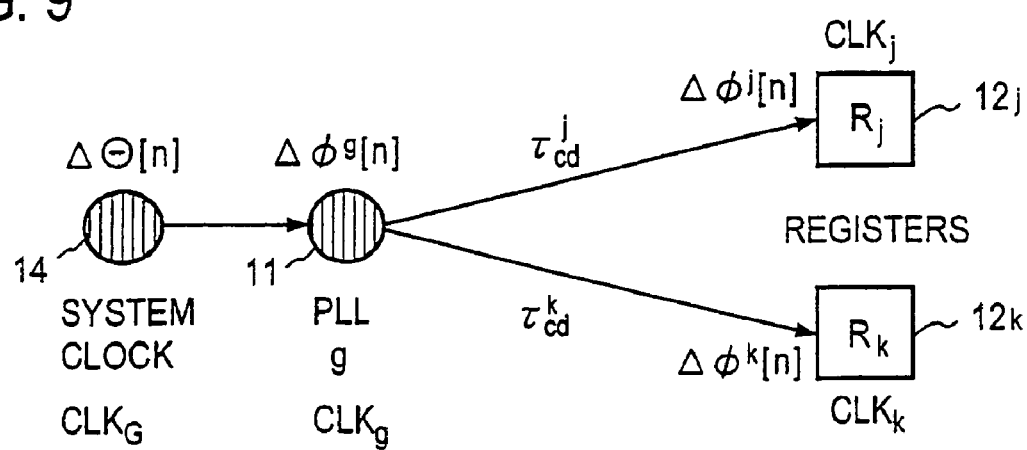
FIG. 9 is a diagram typically showing a clock distribution network having different clock domains.
Figure 10:
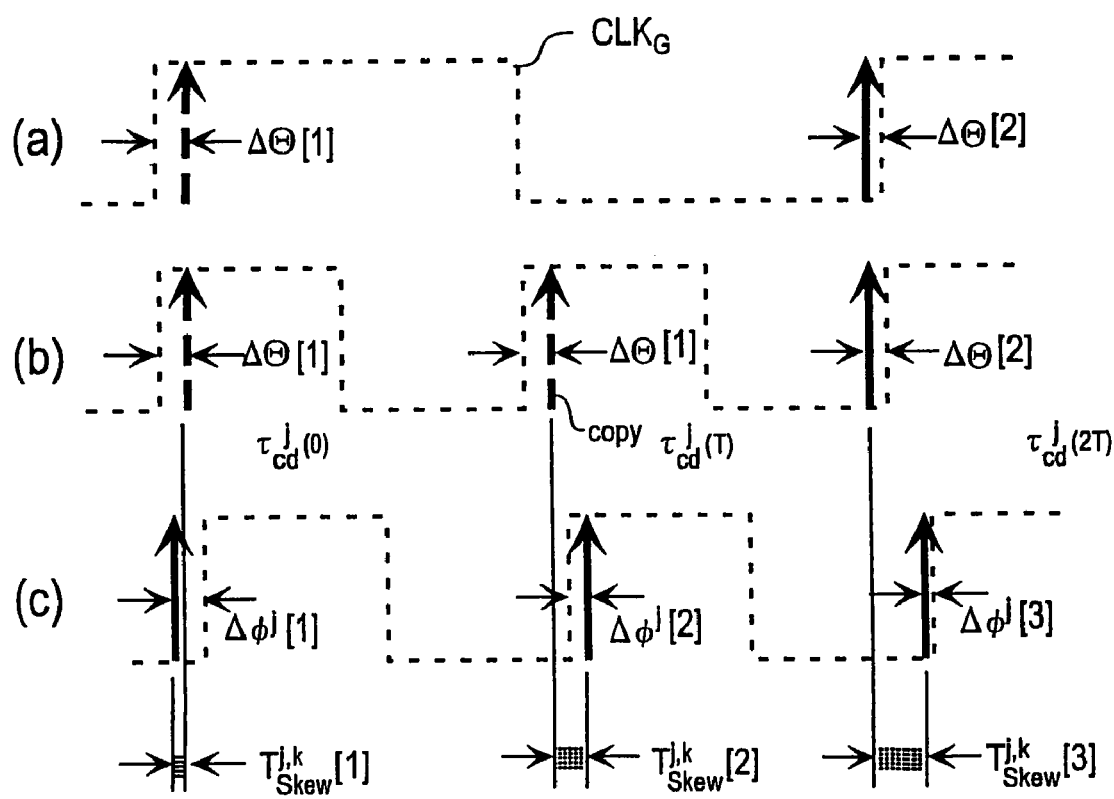
FIG. 10 is a diagram typically showing a principle of clock skew measurement using a frequency multiplication.

As indicated by dashed lines in FIG. 13, a timing jitter sequence estimated by one of the timing jitter estimators 101a and 101b, i.e., the timing jitter sequence $\Delta\phi^k[n]$ estimated by the timing jitter estimator 101b in the case of FIG. 13 may be copied (M−1) times by the frequency multiplier 701 to obtain a timing jitter sequence that is to be obtained when the frequency of the clock signal under measurement $x_k(t)$ is multiplied by M, and to supply the obtained timing jitter sequence to the clock skew estimator 103. By such a process, in the clock distribution system previously described with reference to FIG. 9, the clock signal $x_k(t)$ in FIG. 13 corresponds to the system clock signal $CLK_G$ in FIG. 9, and the clock signal $x_j(t)$ is a signal created by multiplying the frequency of the clock signal $CLK_G(x_k(t))$ by M. In this case, a clock skew $\tau_{Skew}^{G,j}[n]$ between the clock signal $CLK_G(x_k(t))$ and the clock signal $x_j(t)$ can be obtained by the equation (24).

Regarding the processing procedure of the clock skew measurement method in this case, as shown in FIG. 14, after timing jitter sequences are obtained in the step 201, the timing jitter sequence estimated by the timing jitter estimator 101b may be assigned, for example (M−1) times as indicated by dashed lines, in step 801 by the frequency multiplier to obtain a timing jitter sequence that is to be obtained when the frequency of the clock signal under measurement is multiplied by M, and then the process may move to the step 202. At this time, in the step 202 for estimating a deterministic component of clock skew between the clock signals under measurement, the deterministic clock skew estimator 102 obtains a deterministic component of clock skew between the clock signals under measurement using the equation (25). In addition, in the step 203 for estimating a clock skew sequence between the clock signals under measurement, the clock skew estimator 103 obtains a clock skew sequence between the clock signals under measurement using the equation (24).

Also in the case of using the frequency multiplier 701, when the clock skew measurement apparatus is constructed as an apparatus for estimating only random component of clock skew, the deterministic clock skew estimator 102 for obtaining a deterministic component of clock skew may be omitted. In this case, in the clock skew measurement method, the step 202 for estimating a deterministic component of clock skew from the initial phase angles of the clock signals under measurement may be omitted.

In addition, the frequency multiplier 701 may also be built in the clock skew measurement apparatus shown in FIG. 17. In this case, the frequency multiplier is inserted in series in each output side of the timing jitter estimators 101b and 101d. Similarly, a step of multiplying a frequency can also be added to the clock skew measurement method shown in FIG. 18. In this case, the step of multiplying a frequency is inserted after each of the steps 601 and 604 for estimating timing jitters.

Figure 19:
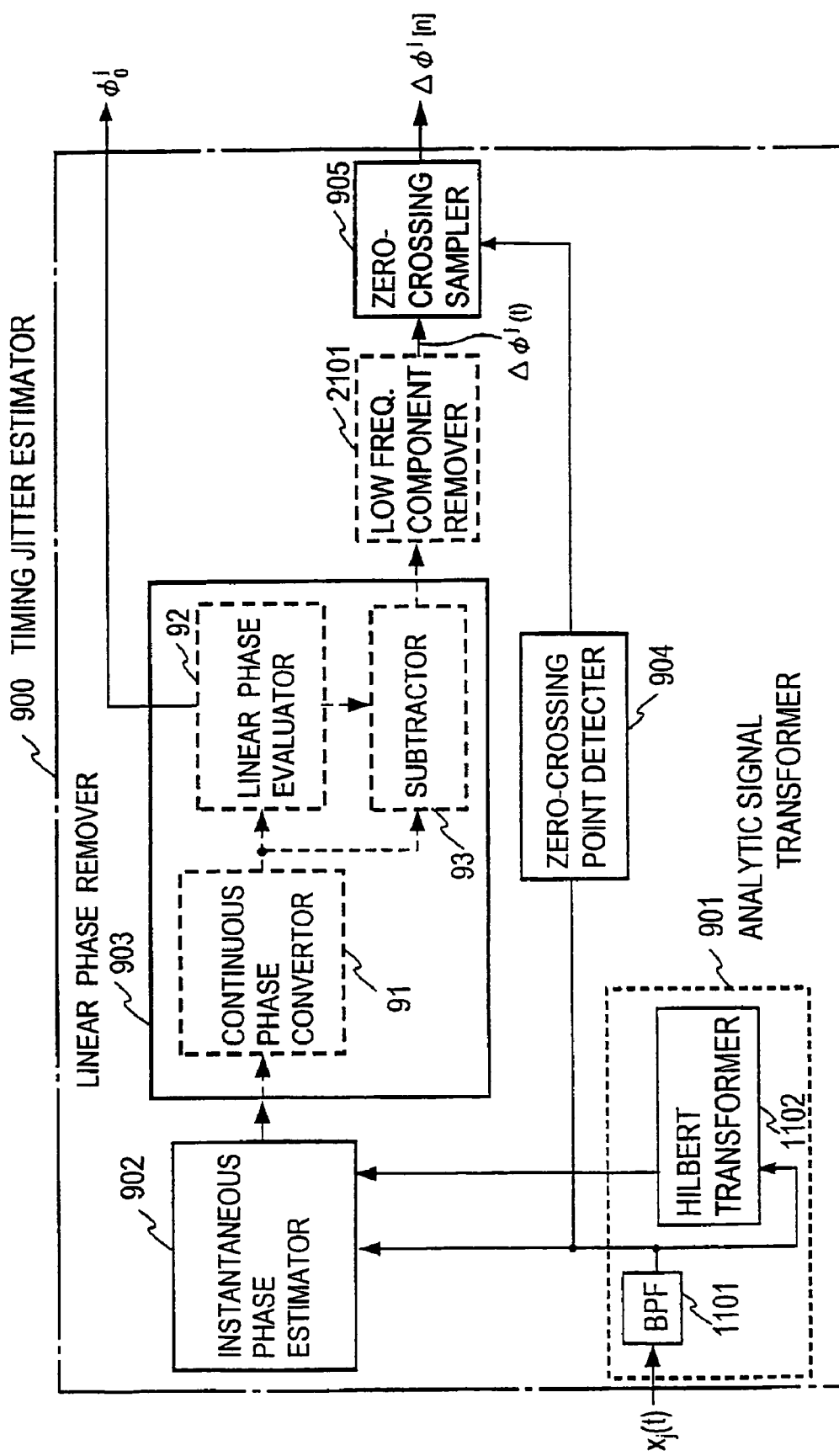
FIG. 19 is a block diagram showing an example of a functional configuration of a timing jitter estimator used in the clock skew measurement apparatus according to the present invention.

FIG. 19 shows an example of configuration of each of the timing jitter estimators 101a, 101b, 101c, and 101d. This timing jitter estimator 900 is described in, for example, "Extraction of Peak-to-Peak and RMS Sinusoidal Jitter Using an Analytic Signal Method" by T. J. Yamaguchi, M. Soma, M. Ishida, T. Watanabe, and T. Ohmi, Proceedings of 18th IEEE VLSI Test Symposium, pp. 395-402, 2000. This timing jitter estimator 900 comprises an analytic signal transformer 901 for transforming a clock signal under measurement into a band-limited complex analytic signal, an instantaneous phase estimator 902 for obtaining an instantaneous phase of the analytic signal transformed by the analytic signal transformer 901, a linear phase remover 903 for removing a linear instantaneous phase from the instantaneous phase estimated by the instantaneous phase estimator 902 to obtain an instantaneous phase noise, a zero-crossing detector 904 to which a real part of the analytic signal is inputted from the analytic signal transformer 901 for generating sampling pulses at timings (approximated zero-crossing points) close to zero-crossing timings of the real part of the analytic signal, a zero-crossing sampler 905 to which the instantaneous phase noise estimated by the linear phase remover 903 is inputted for sampling the instantaneous phase noise using the sampling pulses from the zero-crossing detector 905. The analytic signal transformer 901 may be constructed such that a pass bandwidth of a signal can arbitrarily be changed. In addition, the linear phase remover 903 obtains an initial phase angle of the clock signal under measurement simultaneously with the instantaneous phase noise, and outputs the obtained initial phase angle to the deterministic clock skew estimator.

A processing procedure in this timing jitter estimator 900 will be explained with reference to FIG. 20. In step 1001, an inputted clock signal under measurement is transformed by the analytic signal transformer 901 into an analytic signal whose predetermined frequency components are selectively passed. In step 1002, an instantaneous phase of the clock signal under measurement is estimated by the instantaneous phase estimator 902 using the analytic signal. In step 1003, a linear instantaneous phase corresponding to an ideal clock signal is estimated by the linear phase remover 903 from the instantaneous phase to obtain an initial phase angle of the clock signal under measurement. In step 1004, the linear instantaneous phase is removed by the linear phase remover 903 from the instantaneous phase to estimate an instantaneous phase noise $\Delta\phi'(t)$. At the same time, in step 1005, timings (approximated zero-crossing points) closest to zero-crossing points of a real part of the analytic signal are detected by the zero-crossing detector 904 from the real part of the analytic signal using the previously explained zero-crossing point detection method. Finally, in step 1006, only the instantaneous phase noise data at the approximated zero-crossing points from the instantaneous phase noise are sampled by the zero-crossing sampler 904 to estimate a timing jitter sequence $\Delta\phi'[n]$, and the process ends.

In the analytic signal transformer 901 used in the timing jitter estimator 900, for example as shown in FIG. 19, only components around a fundamental frequency are extracted by a band-pass filter 1101 from the clock signal under measurement to band-limit the clock signal under measurement. In addition, the band-limited clock signal under measurement is inputted to a Hilbert transformer 1102 to Hilbert-transform this signal, and an output of the band-pass filter 1101 is outputted as a real part of the analytic signal. An output of the Hilbert transformer 1102 is outputted as an imaginary part of the analytic signal. The band-pass filter 1101 may be either an analog filter or a digital filter, or may be implemented using a digital signal process such as FFT or the like. In addition, the band-pass filter 1101 may be constructed such that the pass bandwidth of the signal can arbitrarily be changed.

Figure 11:
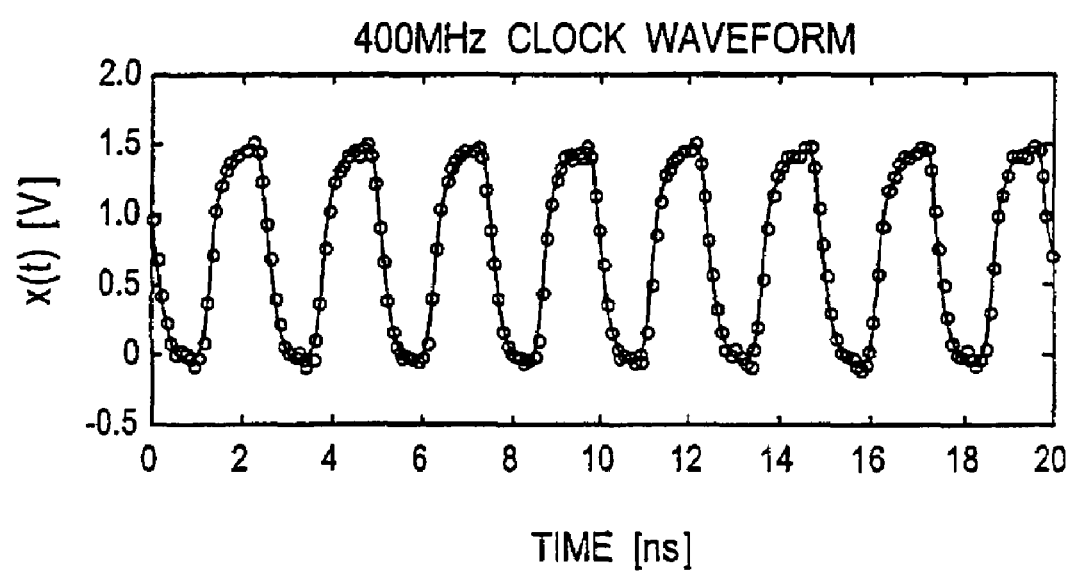
FIG. 11 is a diagram showing an example of a digitized clock signal under measurement.
Figure 12A:
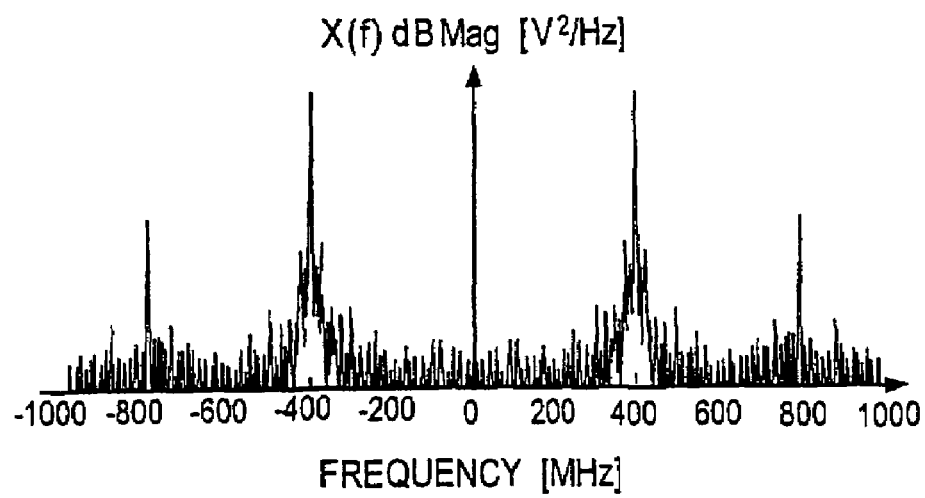
FIG. 12A is a diagram showing an example of a both-sided power spectrum of a clock signal under measurement obtained by FFT.
Figure 12B:
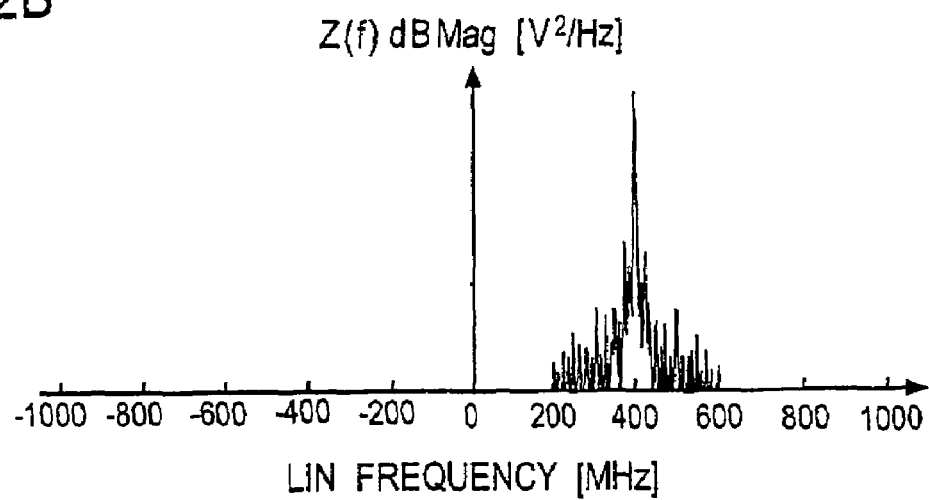
FIG. 12B is a diagram showing an example of a band-limited single-sided power spectrum.
Figure 21:
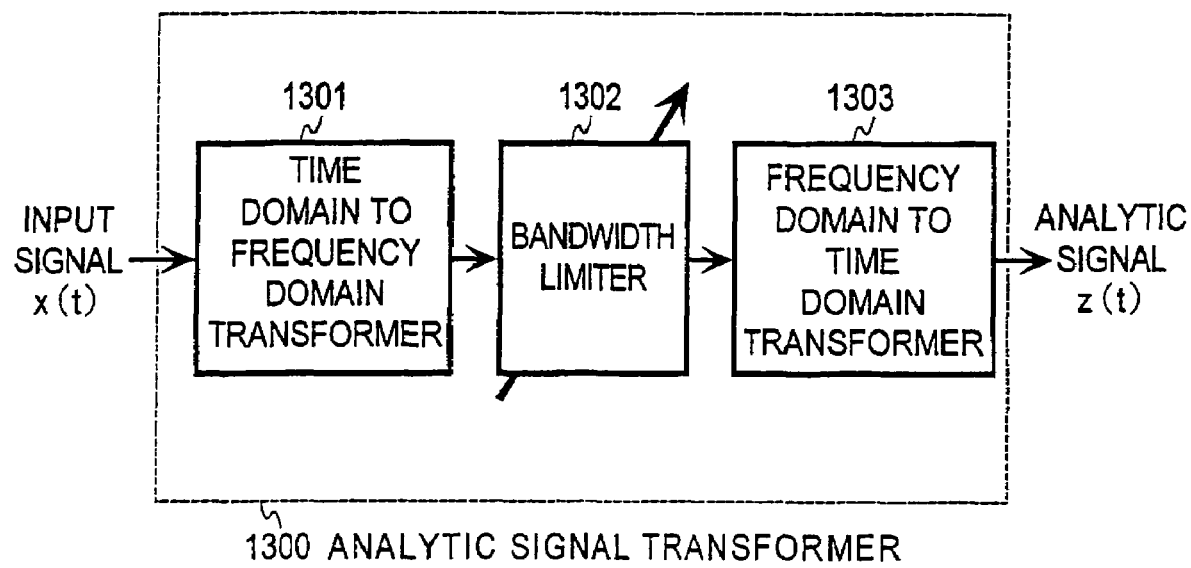
FIG. 21 is a block diagram showing another example of a functional configuration of an analytic signal transformer used in the clock skew measurement apparatus according to the present invention.

FIG. 21 shows another configuration example of the analytic signal transformer 901 used in the timing jitter estimator 900. For example, FFT (Fast Fourier Transform) is applied to the clock signal under measurement by a time domain to frequency domain transformer 1301 to transform a signal in time domain into a both-sided spectrum signal (for example, FIG. 11) in frequency domain. Negative frequency components of the transformed both-sided spectrum signal in frequency domain are replaced by zero by the bandwidth limiter 1302 to obtain a single-sided spectrum signal. In addition, regarding this single-sided spectrum signal, only components around the fundamental frequency of the clock signal under measurement are retained and the other frequency components are replaced by zeros to band-limit the signal in frequency domain. Inverse FFT is applied by a frequency domain to time domain transformer 1303 to the band-limited single-sided spectrum signal to transform the signal in frequency domain into an analytic signal in time domain.

Figure 22:
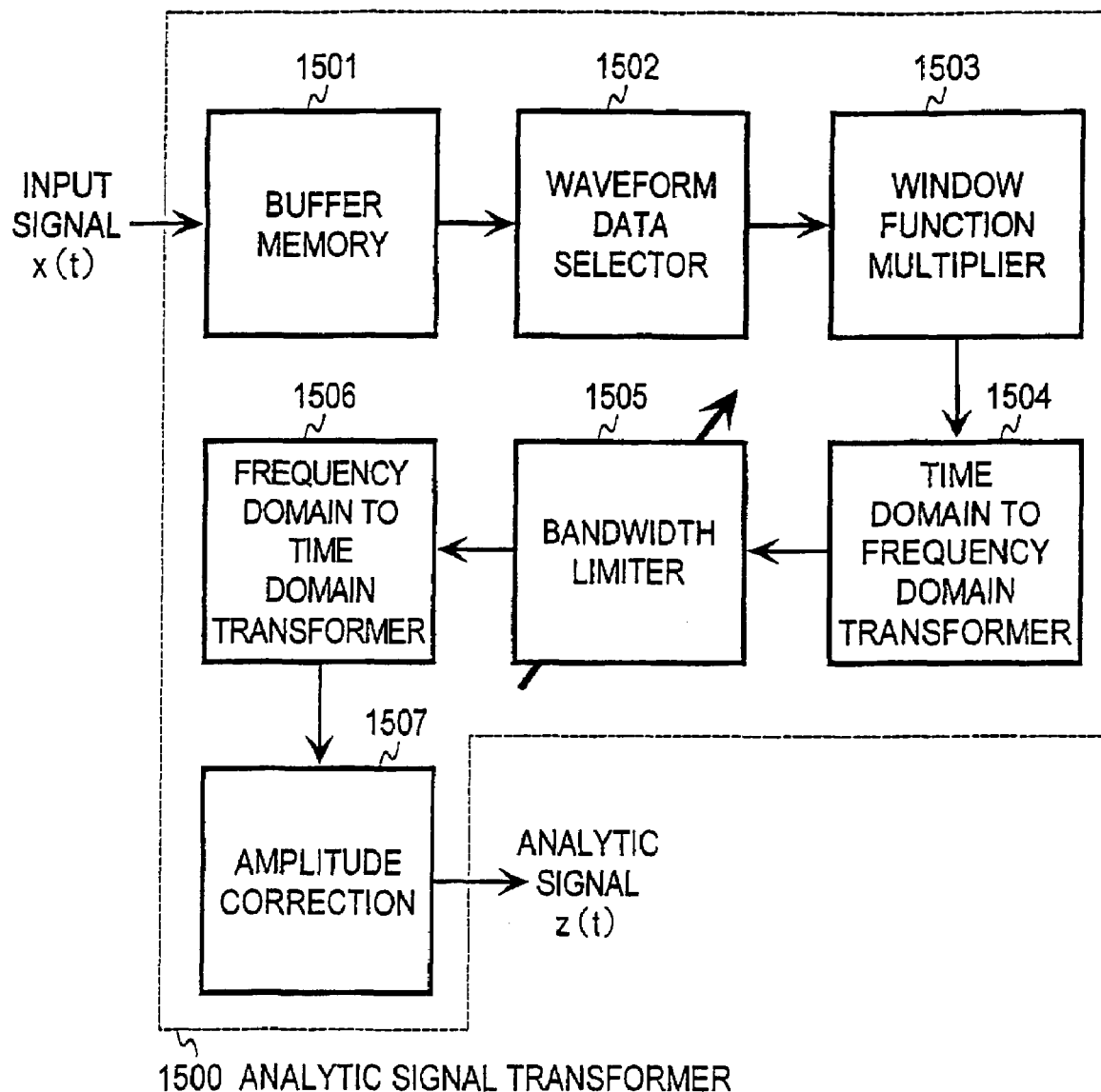
FIG. 22 is a block diagram showing further another example of a functional configuration of an analytic signal transformer used in the clock skew measurement apparatus according to the present invention.

FIG. 22 shows further another configuration example of the analytic signal transformer 901 used in the timing jitter estimator 900. This analytic signal transformer 1500 comprises a buffer memory 1501 for storing therein a clock signal under measurement, a signal extractor (waveform data selector) 1502 for extracting the signal in the sequential order from the buffer memory 1501 such that the signal being extracted is partially overlapped with the signal extracted just before, a window function multiplier 1503 for multiplying each extracted partial signal by a window function, a time domain to frequency domain transformer 1504 for transforming each partial signal multiplied by the window function into a both-sided spectrum signal in frequency domain, a bandwidth limiter 1505 for extracting only components around a positive fundamental frequency of the clock signal under measurement from the both-sided spectrum signal transformed in frequency domain, a frequency domain to time domain transformer 1506 for inverse-transforming an output of the bandwidth limiter 1505 into a signal in time domain, and an inverse window function multiplier 1507 for multiplying the transformed signal in time domain by an inverse number of the window function to obtain a band-limited analytic signal. The time domain to frequency domain transformer 1504 and the frequency domain to time domain transformer 1506 may be packaged using FFT and inverse FFT, respectively. In addition, the bandwidth limiter 1505 may be constructed such that the pass bandwidth of the signal can arbitrarily be changed.

Figure 23:
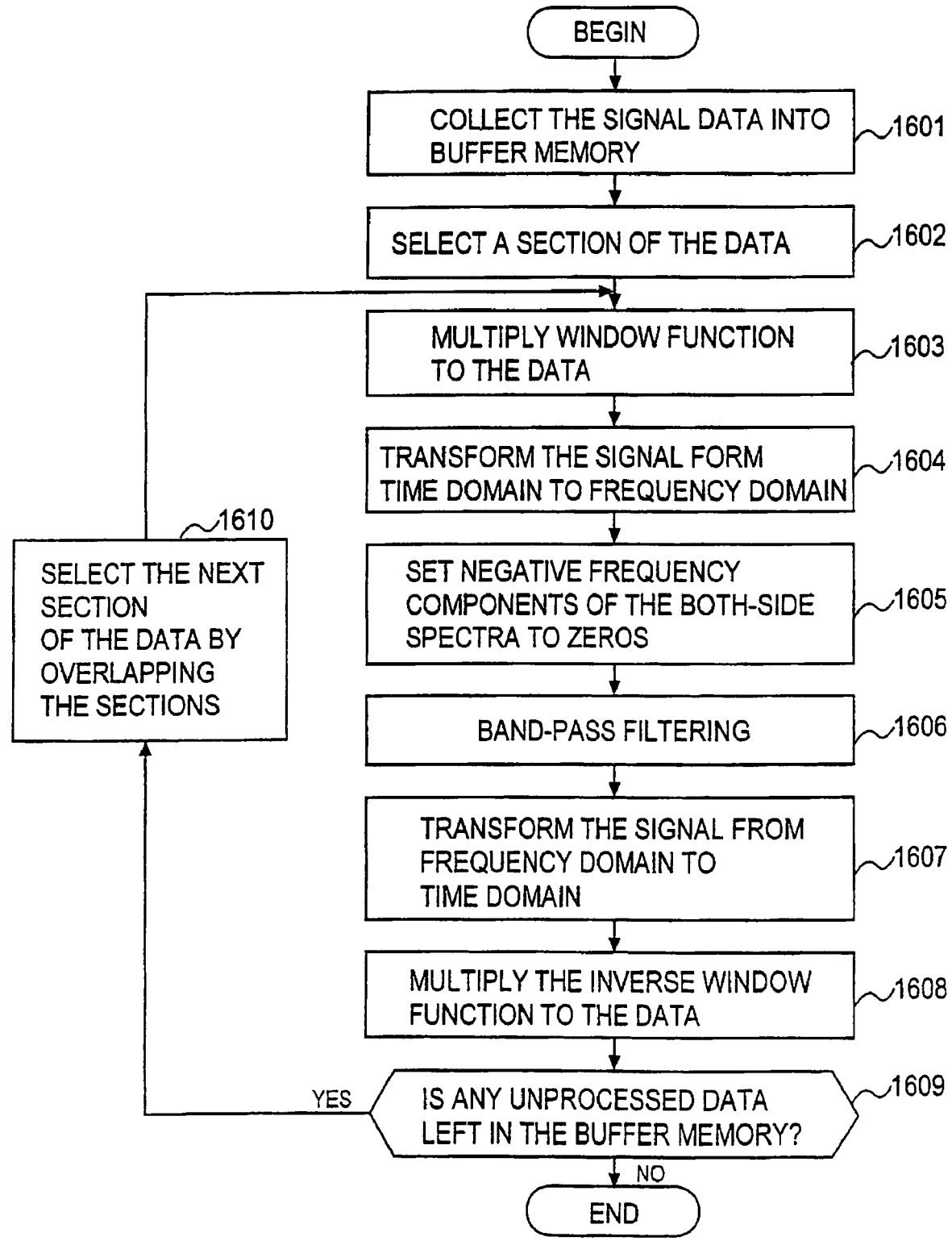
FIG. 23 is a flow-chart showing further another example of the analytic signal transformation method used in the clock skew measurement method according to the present invention.

The operation in the case of transforming the clock signal under measurement into a band-limited analytic signal using this analytic signal transformer 1500 will be described with reference to FIG. 23. First, in step 1601, the buffer memory 1501 stores therein the clock signal under measurement. Next, in step 1602, the signal extractor (waveform data selector) 1502 extracts a portion of the stored signal from the buffer memory 1501. In step 1603, the window function multiplier 1503 multiplies the extracted sectioned signal by the window function. In step 1604, the time domain to frequency domain transformer 1504 applies FFT to the partial signal multiplied by the window function to transform the signal in time domain into a both-sided spectrum signal in frequency domain. In step 1605, the bandwidth limiter 1505 replaces negative frequency components of the transformed both-sided spectrum signal in frequency domain with zero. Furthermore, in step 1606, the bandwidth limiter 1505 retains only components around the fundamental frequency of the clock signal under measurement in the single-sided spectrum signal produced by replacing negative frequency components with zero and replaces the other frequency components with zero to limit the bandwidth of the signal in frequency domain. In step 1607, the frequency domain to time domain transformer 1506 applies inverse FFT to the band-limited single-sided spectrum signal in frequency domain to transform the signal in frequency domain into a signal in time domain. In step 1608, the inverse window function multiplier 1507 multiplies the inverse-transformed signal in time domain by an inverse number of the window function used in the multiplication in the step 1603 to obtain a band-limited analytic signal. Finally, in step 1609, a check is made to see if there is unprocessed data remaining in the buffer memory 1603. If there is unprocessed data remaining in the buffer memory, the signal extractor 1502 extracts, in step 1610, the signal in the sequential order from the buffer memory 1501 such that the signal being extracted is partially overlapped with the signal extracted just before, and thereafter the steps 1603, 1604, 1605, 1606, 1607, 1608 and 1609 are repeated. If there is no unprocessed data, the process ends. The processing sequence of the step 1605 and the step 1606 may be exchanged. That is, only components around the fundamental frequency of the signal under measurement are retained and the other frequency components are replaced with zeros first to limit the bandwidth of the signal in frequency domain, and thereafter negative frequency components of the both-sided spectrum signal may be replaced with zero.

In the linear phase remover 903 in the timing jitter estimator 900 shown in FIG. 19, for example as illustrated in the figure, an inputted instantaneous phase is converted into a continuous instantaneous phase by a continuous phase converter 91. Regarding the continuous instantaneous phase, a linear instantaneous phase corresponding to a jitter-free ideal signal is estimated by a linear phase estimator 92 using, for example, a linear trend estimation method, i.e., by applying a linear line fitting by least squares method to the continuous instantaneous phase, to output an initial phase angle $\phi_0^j(t)$ of the clock signal under measurement $x_j(t)$. In addition, the linear instantaneous phase is subtracted from the continuous instantaneous phase by a subtractor 93 to output an instantaneous phase noise $\Delta\phi(t)$.

Further, FIG. 19, FIG. 21, and FIG. 22 are shown in the international publication WO00/46606 (published on Aug. 10, 2000) report.

As indicated by dashed lines in FIG. 13, analog clock signals under measurement $x_j(t)$ and $x_k(t)$ may be digitized by AD converters 1701a and 1701b, respectively to convert the analog clock signals into digital signals, and the digital signals may be inputted to the respective timing jitter estimators 101a and 101b. In addition, as indicated by dashed lines in FIG. 13, waveform clippers 1901a and 1901b may be provided to supply those input signals $x_j(t)$ and $x_k(t)$ to the AD converters 1701a and 1701b or the timing jitter estimators 101a and 101b, respectively after removing AM components in the state that phase modulation components, that are jitter components of the respective input signals, are retained in the input signals. The waveform clippers 1901a and 1901b may be provided in the output sides of the AD converters 1701a and 1701b, respectively.

In addition, as indicated by dashed lines in FIG. 19, low frequency components of the instantaneous phase noise may be removed by a low frequency component remover 2101 from the instantaneous phase noise $\Delta\phi(t)$ outputted from the linear phase remover 903, and the instantaneous phase noise from which low frequency components have been removed may be supplied to the zero-crossing sampler 905.

In the above description, the instantaneous phase noise $\Delta\phi^j(t)$ is sampled at approximated zero-crossing points to obtain a timing jitter sequence $\Delta\phi^j[n]$. However, since the linear phase remover 903 has a configuration as shown in FIG. 19, for example as indicated by dashed lines in FIG. 24, the sampling at approximated zero-crossing points may be inserted in series between the instantaneous phase estimator 902 and the continuous phase converter 91. Alternatively, the sampling at approximated zero-crossing points may be inserted in series between the continuous phase converter 91 and the linear phase estimator 92/subtractor 93. In such a configuration, a timing jitter sequence $\Delta\phi^j[n]$ can also be obtained from the subtractor 93.

Figure 20:
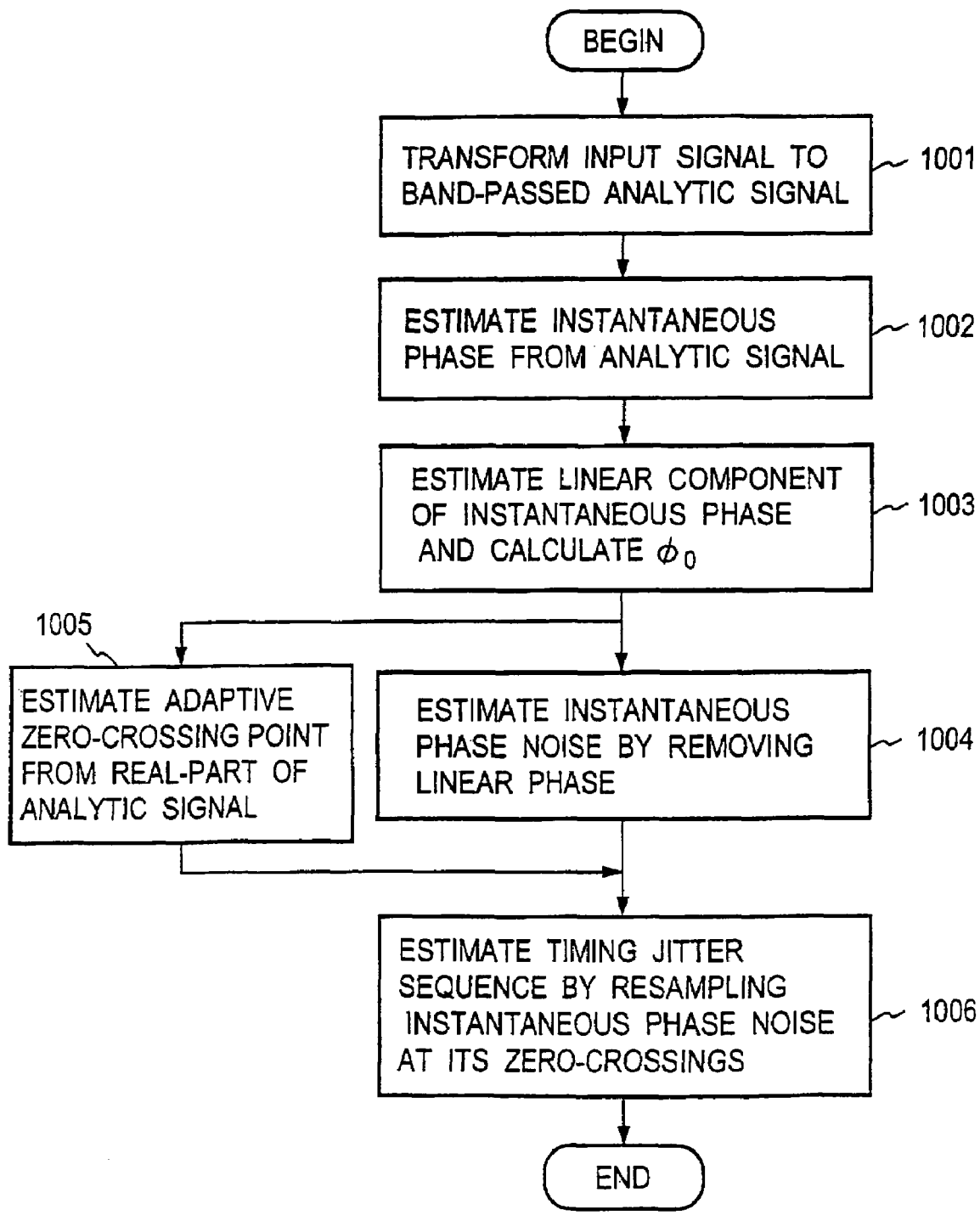
FIG. 20 is a flow-chart showing an example of a timing jitter estimation method used in the clock skew measurement method according to the present invention.
Figure 25:
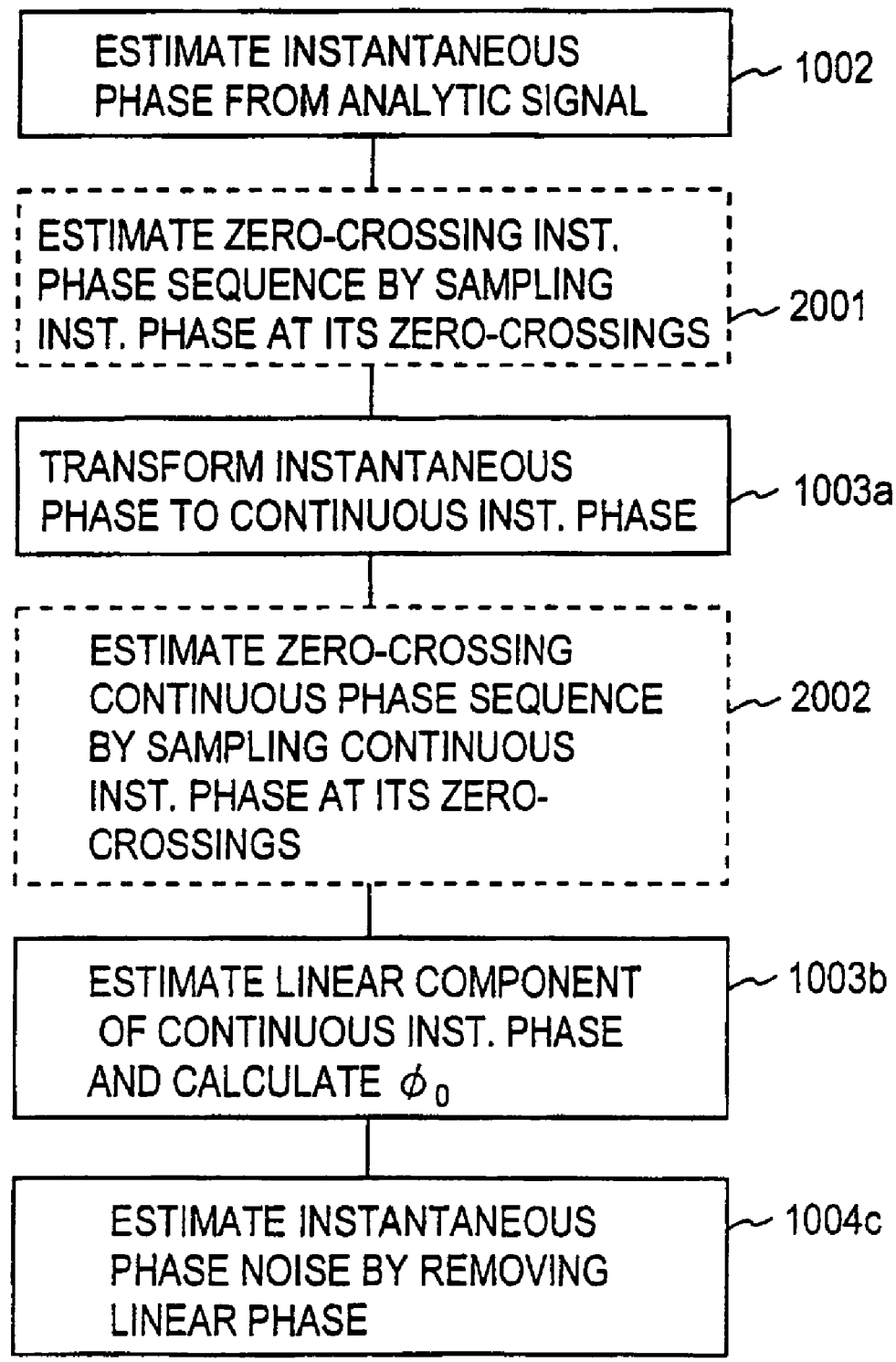
FIG. 25 is a flow-chart showing a portion of another embodiment of the method according to the present invention.

In addition, since the estimation of an instantaneous phase noise $\Delta\phi(t)$ from an instantaneous phase is performed by the configuration shown by the linear phase remover 903 in FIG. 19, the processing procedure is, as shown in FIG. 25, that after an instantaneous phase is obtained in the step 1002 in FIG. 20, in step 1003a, the instantaneous phase is converted into a continuous instantaneous phase by the continuous phase converter 91, and in step 1003b, a linear instantaneous phase of the continuous instantaneous phase is estimated by the linear phase estimator 92 from the continuous instantaneous phase. After that, in step 1004, the linear instantaneous phase is removed by the subtractor 93 from the continuous instantaneous phase to obtain an instantaneous phase noise $\Delta\phi(t)$.

Figure 24:
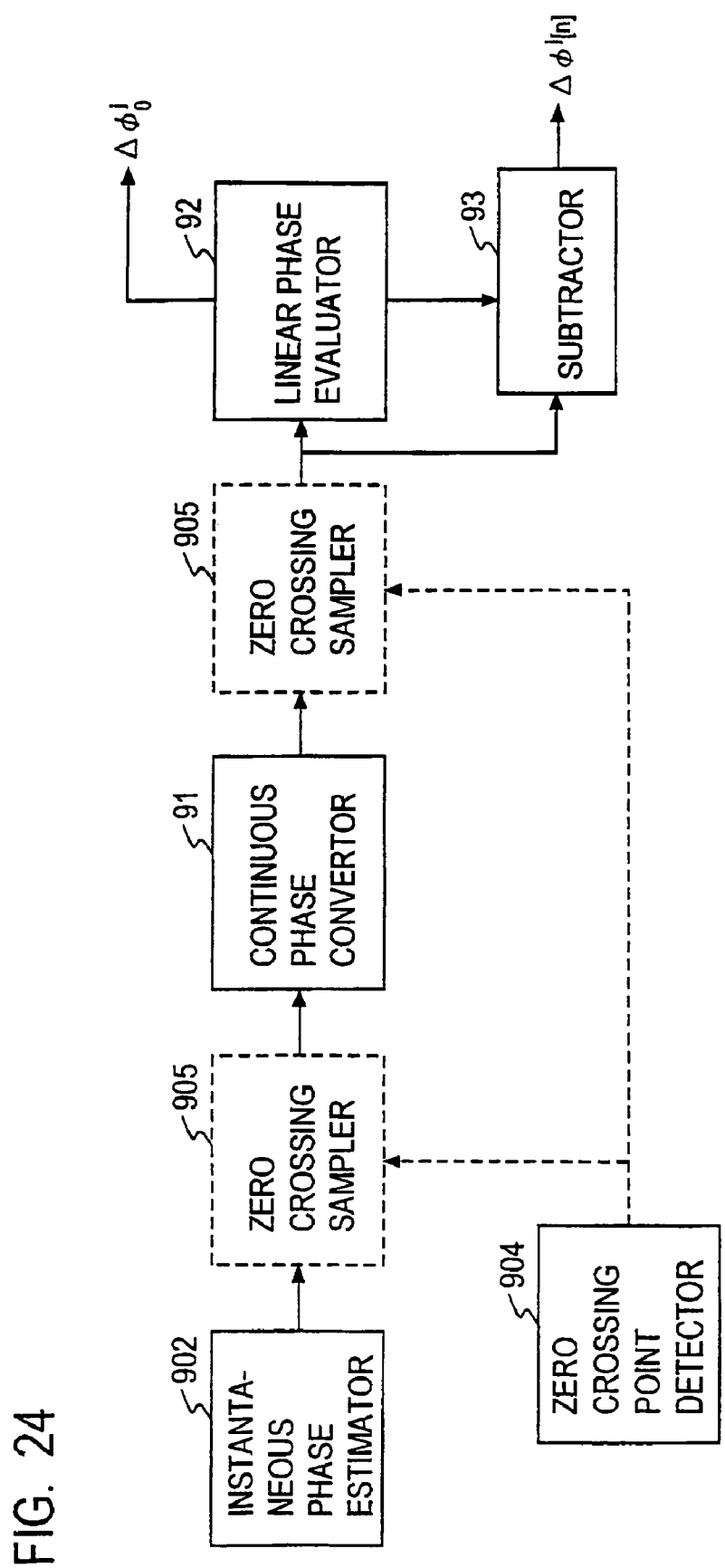
FIG. 24 is a block diagram showing a portion of another embodiment of the apparatus according to the present invention.

Therefore, similarly to the configuration shown in FIG. 24, as indicated by dashed lines in FIG. 25, the approximated zero-crossing sampling may be applied to the instantaneous phase in step 2001 after the step 1002 to obtain a sample sequence of the instantaneous phase. And then the process may move to the step 1003a to transform the sample sequence into a continuous instantaneous phase.

Alternatively, in step 2002, the continuous phase obtained in the step 1003a may be sampled at the approximated zero-crossing points to obtain a sample sequence of the continuous instantaneous phase, and then the process may move to step 1003b to estimate an instantaneous linear phase from the sample sequence of the continuous instantaneous phase. In either case, in step 1004, there is obtained a timing jitter sequence $\Delta\phi^j[n]$ by sampling the instantaneous phase noise at the approximated zero-crossing points.

Figure 26:
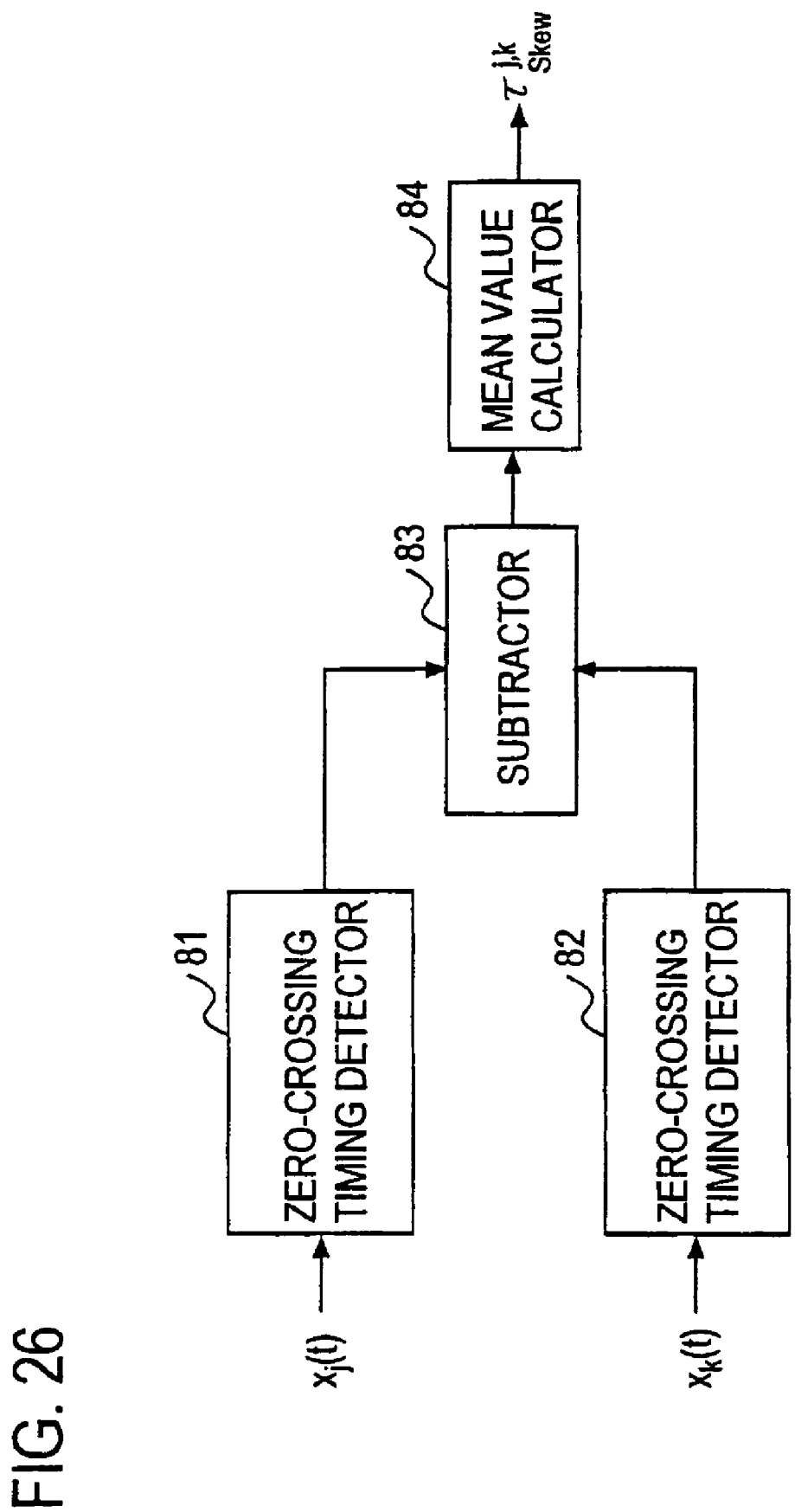
FIG. 26 is a block diagram showing another example of a functional configuration of the deterministic clock skew estimator 102.

Regarding the deterministic clock skew estimator 102 in FIG. 14, for example, as shown in FIG. 26, the clock signals under measurement $x_j(t)$ and $x_k(t)$ may be inputted to zero-crossing timing detectors 81 and 82, respectively. Then zero-crossing timing sequences $t^j_{zero,c}(n)$ and $t^k_{zero,c}(n)$ of those respective signals may be inputted to a subtractor 83 to obtain a time difference sequence between corresponding zero-crossing time points of the zero-crossing timing sequences $t^j_{zero,c}(n)$ and $t^k_{zero,c}(n)$. Then a mean value of those time differences may be calculated by a mean value calculator 84 to obtain the mean value as a deterministic clock skew value $\tau^{j,k}_{skew}$.

The apparatus shown in FIG. 13 and FIG. 17 can be functioned by executing programs in a computer.

According to the clock skew measurement apparatus and the clock skew measurement method of the present invention, a random spread (random components) of clock skew can be measured, and therefore an efficiency of clock skew test can greatly be improved. Moreover, if necessary, the apparatus can be constructed such that one of the clock skew components that is deterministically determined by clock distribution network paths are also simultaneously measured.

In addition, according to the embodiments of the clock skew measurement apparatus and the clock skew measurement method of the present invention, a clock skew between clock signals each having a different frequency from one another can be obtained. By this, a clock signal having relatively low frequency can be used as a reference clock signal in a clock skew test, and therefore an efficiency and a practical usability of a clock skew test can greatly be improved.

In addition, according to the embodiments of the clock skew measurement apparatus and the clock skew measurement method of the present invention, a clock skew between clock signals under measurement can be estimated by simultaneously sampling in the sequential order clock waveforms under measurement utilizing an apparatus that can simultaneously measure two channels. By this, the number of required simultaneous samplings can be decreased from $_NC_2(=N(N-1)/2)$ to (N−1) two-channel simultaneous measurements, and therefore a measurement time of clock skew can greatly be decreased.

In addition, according to the clock skew measurement apparatus and the clock skew measurement method of the present invention, only the minimum number of pins are required when clock signals to be distributed within, for example, a semiconductor chip are taken out to the outside of the chip. Therefore, the test expense of VLSI test can be reduced.

The invention claimed is:

1. An apparatus for measuring a clock skew between at least first and second clock signals under measurement, the apparatus comprising:
   first and second timing jitter estimators to which the first and second clock signals under measurement are respectively inputted for estimating respective instantaneous timing jitter sequences to output first and second instantaneous timing jitter sequences; and
   a clock skew estimator to which the first and second instantaneous timing jitter sequences are inputted for calculating a timing difference sequence between first and second instantaneous timing jitter sequences to output a random component of a clock skew between the first and second clock signals.

2. The apparatus according to claim 1 further comprising a deterministic clock skew estimator for estimating a deterministic component of the clock skew between the first and second clock signals under measurement, wherein said first and second timing jitter estimators are adapted further to estimate initial phase angles of said first and second clock signals to output first and second initial phase angles, respectively, said deterministic clock skew estimator is adapted to estimate the deterministic component of the clock skew between the first and second clock signals from a difference between the first and second initial phase angles, and said clock skew estimator is adapted to add the deterministic component to the random component of the clock skew to output the clock skew sequence between the first and second clock signals.

3. The apparatus according to claim 2 further comprising a frequency multiplier to which the second instantaneous timing jitter sequence is inputted, wherein
   said second clock signal is a reference clock signal;
   said first clock signal is a signal created by multiplying the frequency of the reference clock signal by M, where M is an integer equal to or greater than two; and
   said frequency multiplier is adapted to multiply a frequency of the second instantaneous timing jitter sequence by M to output the frequency-multiplied instantaneous timing jitter sequence to said clock skew estimator.

4. The apparatus according to claim 1 further comprising a frequency multiplier to which the second instantaneous timing jitter sequence is inputted, wherein
   said second clock signal is a reference clock signal;
   said first clock signal is a signal created by multiplying the frequency of the reference clock signal by M, where M is an integer equal to or greater than two; and
   said frequency multiplier is adapted to multiply the frequency of the second instantaneous timing jitter sequence by M to output the frequency-multiplied instantaneous timing jitter sequence to said clock skew estimator.

5. An apparatus for measuring a clock skew between first and second clock signals among at least three clock signals under measurement that include the first and the second clock signals and a third clock signal, the apparatus comprising:
   first, second and third timing jitter estimators to which the first, second and third clock signals under measurement are respectively inputted for estimating respective timing jitter sequences to thereby output first, second and third instantaneous timing jitter sequences;
   a first clock skew estimator to which the first and third instantaneous timing jitter sequences are inputted for calculating a timing difference sequence between the first and third timing jitter sequences to output a random component of a first clock skew between the first and third clock signals;
   a second clock skew estimator to which the second and third instantaneous timing jitter sequences are inputted for calculating a timing difference sequence between the second and third timing jitter sequences to output a random component of a second clock skew between the second and third clock signals; and
   a third clock skew estimator to which the random components of the first and second clock skews are inputted for calculating a difference between the random components of the first and second clock skews to estimate a random component of a clock skew between the first and second clock signals.

6. The apparatus according to claim 5 further comprising:
a first deterministic clock skew estimator for estimating a deterministic component of the first clock skew between the first and third clock signals; and
a second deterministic clock skew estimator for estimating a deterministic component of the second clock skew between the second and third clock signals;
wherein
said first, second and third timing jitter estimators are adapted further to estimate initial phase angles of said first, second and third clock signals to output first, second and third initial phase angles, respectively;
said first deterministic clock skew estimator is adapted to estimate the deterministic component of the first clock skew between the first and third clock signals from a difference between the first and third initial phase angles;
said second deterministic clock skew estimator is adapted to estimate the deterministic component of the second clock skew between the second and third clock signals from a difference between the second and third initial phase angles;
said first clock skew estimator is adapted to add the random component of the first clock skew to the deterministic component of the first clock skew to estimate a first clock skew sequence between the first and third clock signals;
said second clock skew estimator is adapted to add the random component of the second clock skew to the deterministic component of the second clock skew to estimate a second clock skew sequence between the second and third clock signals; and
said third clock skew estimator is adapted to calculate a difference between the first and second clock skew sequences to thereby estimate a clock skew sequence between the first and second clock signals.

7. The apparatus according to claim 6 further comprising a frequency multiplier to which the third instantaneous timing jitter sequence is inputted, wherein
said third clock signal is a reference clock signal;
said first and second clock signals are signals created by multiplying the frequency of the reference clock signal by M, where M is an integer equal to or greater than two; and
said frequency multiplier is adapted to multiply a frequency of the third instantaneous timing jitter sequence by M to output the frequency-multiplied instantaneous timing jitter sequence to said first and second clock skew estimators, respectively.

8. The apparatus according to claim 5 further comprising a frequency multiplier to which the third instantaneous timing jitter sequence is inputted, wherein
said third clock signal is a reference clock signal;
said first and second clock signals are signals created by multiplying the frequency of the reference clock signal by M, where M is an integer equal to or greater than two; and
said frequency multiplier is adapted to multiply a frequency of the third instantaneous timing jitter sequence by M to output the frequency-multiplied instantaneous timing jitter sequence to said first and second clock skew estimators, respectively.

9. The apparatus according to claim 1 or 5, wherein each of said timing jitter estimators comprises:
an analytic signal transformer for transforming a clock signal under measurement into a complex analytic signal;
an instantaneous phase estimator for obtaining an instantaneous phase of the analytic signal; and
a linear phase remover that comprises:
a continuous phase converter for converting the instantaneous phase into a continuous instantaneous phase;
a linear phase estimator for estimating linear instantaneous phase from the continuous instantaneous phase; and
a subtractor for removing the linear instantaneous phase from the continuous instantaneous phase to obtain an instantaneous phase noise.

10. The apparatus according to claim 9, wherein said timing jitter estimator further comprises:
a zero-crossing detector for generating sampling pulses at timings close to zero-crossing timings of a real part of the analytic signal; and
a zero-crossing sampler for sampling its input at timings of the sampling pulses to output the sampled signal, wherein said zero-crossing sampler is:
inserted in series to connection points between said instantaneous phase estimator and said continuous phase converter,
inserted in series to connection points between said continuous phase converter and said linear phase estimator as well as said subtractor, or
connected at an output side of said subtractor;
whereby said timing jitter estimator outputs an instantaneous timing jitter sequence of the clock signal under measurement.

11. The apparatus according to claim 9, wherein said timing jitter estimator includes a low frequency component remover to which the instantaneous phase noise is inputted for removing low frequency components of the instantaneous phase noise to output the instantaneous phase noise from which the low frequency components have been removed.

12. The apparatus according to claim 9, wherein said analytic signal transformer can change a pass bandwidth of the clock signal under measurement.

13. The apparatus according to claim 2 or 6, wherein each of said timing jitter estimators comprises:
an analytic signal transformer for transforming a clock signal under measurement into a complex analytic signal;
an instantaneous phase estimator for obtaining an instantaneous phase of the analytic signal; and
a linear phase remover that comprises:
a continuous phase converter for converting the instantaneous phase into a continuous instantaneous phase;
a linear phase estimator for estimating linear instantaneous phase and initial phase angle from the continuous instantaneous phase; and
a subtractor for removing the linear instantaneous phase from the continuous instantaneous phase to obtain an instantaneous phase noise.

14. The apparatus according to claim 13, wherein said timing jitter estimator further comprises:
a zero-crossing detector for generating sampling pulses at timings close to zero-crossing timings of a real part of the analytic signal; and
a zero-crossing sampler for sampling its input at timings of the sampling pulses to output the sampled signal, wherein said zero-crossing sampler is:
inserted in series to connection points between said instantaneous phase estimator and said continuous phase converter, inserted in series to connection points between said continuous phase converter and said linear phase estimator as well as said subtractor, or connected at an output side of said subtractor;

whereby said timing jitter estimator outputs an instantaneous timing jitter sequence of the clock signal under measurement.

15. The apparatus according to claim 13, wherein said timing jitter estimator includes a low frequency component remover to which the instantaneous phase noise is inputted for removing low frequency components of the instantaneous phase noise to output the instantaneous phase noise from which the low frequency components have been removed.

16. The apparatus according to claim 13, wherein said analytic signal transformer can change a pass bandwidth of the clock signal under measurement.

17. The apparatus according to claim 2 or 6 further comprising a clock skew detector to which the clock skew sequence is inputted for obtaining clock skew values thereof.

18. The apparatus according to claim 17, wherein said clock skew detector comprises one or a plurality of:
a peak-to-peak detector for obtaining a difference between the maximum value and the minimum value of the clock skew sequence,
an RMS detector for obtaining a root-mean-square value of the clock skew sequence, and
a histogram estimator for obtaining a histogram of the clock skew sequence.

19. The apparatus according to claim 1 or 5 further comprising a clock skew detector to which the random component of the clock skew is inputted for obtaining clock skew values thereof.

20. The apparatus according to claim 19, wherein said clock skew detector comprises one or a plurality of:
a peak-to-peak detector for obtaining a difference between the maximum value and the minimum value of the random component of the clock skew,
an RMS detector for obtaining a root-mean-square value of the random component of the clock skew, and
a histogram estimator for obtaining a histogram of the random component of the clock skew.

21. An apparatus for measuring a clock skew between at least first and second clock signals under measurement, the apparatus comprising:
first and second timing jitter estimators to which the first and second clock signals under measurement are inputted for estimating respective initial phase angles to output first and second initial phase angles; and
a deterministic clock skew estimator for estimating a deterministic component of the clock skew between the first and second clock signals from a difference between the first and second initial phase angles.

22. An apparatus for measuring a clock skew between first and second clock signals among at least three clock signals under measurement that include the first and the second clock signals and a third clock signal, the apparatus comprising:
first, second and third timing jitter estimators to which the first, second and third clock signals under measurement are respectively inputted for estimating respective initial phase angles to output first, second and third initial phase angles;
a first deterministic clock skew estimator for estimating a deterministic component of a first clock skew between the first and third clock signals from a difference between the first and third initial phase angles;
a second deterministic clock skew estimator for estimating a deterministic component of a second clock skew between the second and third clock signals from a difference between the second and third initial phase angles; and
a third deterministic clock skew estimator for estimating a deterministic component of the clock skew between the first and second clock signals from a difference between the deterministic components of the first and second clock skews.

23. The apparatus according to claim 21 or 22, wherein each of said timing jitter estimators comprises:
an analytic signal transformer for transforming a clock signal under measurement into a complex analytic signal;
an instantaneous phase estimator for obtaining an instantaneous phase of the analytic signal;
a continuous phase converter for converting the instantaneous phase into a continuous instantaneous phase; and
a linear phase estimator for estimating initial phase angle from the continuous instantaneous phase.

24. The apparatus according to claim 23, wherein said analytic signal transformer can change a pass bandwidth of the clock signal under measurement.

25. The apparatus according to claim 2 or 21, wherein said first and second timing jitter estimators are adapted further to estimate respective instantaneous phase noises of the first and second clock signals inputted thereto to output a first and a second instantaneous phase noises; and
said deterministic clock skew estimator comprises:
an offset estimator for estimating an offset position at which a correlative value between the first and second instantaneous timing jitter sequences or a correlative value between the first and second instantaneous phase noises becomes the largest value to obtain an offset value between corresponding clock edges of the first and second clock signals under measurement; and
a deterministic clock skew calculator for calculating a deterministic component of the clock skew between the first and second clock signals from the first and second initial phase angles and the offset value.

26. The apparatus according to claim 6 or 22, wherein said first, second and third timing jitter estimators are adapted further to estimate instantaneous phase noises of the first, second and third clock signals inputted thereto to output a first, a second and a third instantaneous phase noises;
said first deterministic clock skew estimator comprises:
a first offset estimator for estimate an offset position at which a correlative value between the first and third instantaneous timing jitter sequences or a correlative value between the first and third instantaneous phase noises becomes the largest value to output a first offset value between corresponding clock edges of the first and third clock signals under measurement, and
a first deterministic clock skew calculator for calculating a deterministic component of the first clock skew from the first and third initial phase angles and the first offset value; and
said second deterministic clock skew estimator comprises:

a second offset estimator for estimating an offset position at which a correlative value between the second and third instantaneous timing jitter sequences or a correlative value between the second and third instantaneous phase noises becomes the largest value to output a second offset value between corresponding clock edges of the second and third clock signals under measurement, and a second deterministic clock skew calculator for calculating a deterministic component of the second clock skew from the second and third initial phase angles and the second offset value.

27. The apparatus according to claim 1 or 5 further comprising means for digitizing an input analog signal into a digital signal when the clock signal under measurement is the analog signal.

28. A method of measuring a clock skew between at least first and second clock signals under measurement, the method comprising the steps of:

estimating instantaneous timing jitter sequences of the respective first and second clock signals under measurement to obtain first and second instantaneous timing jitter sequences or first and second instantaneous phase noises; and estimating a random component of the clock skew between the first and second clock signals by calculating a timing difference sequence between the first and second instantaneous timing jitter sequences.

29. The method according to claim 28 further comprising the steps of:

estimating initial phase angles of the first and second clock signals under measurement to obtain first and second initial phase angles;

estimating a deterministic component of the clock skew between the first and second clock signals by calculating a difference between the first and second initial phase angles; and estimating a clock skew sequence between the first and second clock signals by calculating a sum of the deterministic component and the random component of the clock skew.

30. The method according to claim 29 further comprising a step of assigning each timing jitter of the second instantaneous timing jitter sequence (M−1) times to estimate a frequency-multiplied instantaneous timing jitter sequence that is created by multiplying a frequency of the corresponding second clock signal under measurement by M, where M is an integer equal to or greater than two.

31. The method according to claim 28 further comprising a step of assigning each timing jitter of the second instantaneous timing jitter sequence (M−1) times to estimate a frequency-multiplied instantaneous timing jitter sequence that is created by multiplying a frequency of the corresponding second clock signal under measurement by M, where M is an integer equal to or greater than two.

32. A method of measuring a clock skew between first and second clock signals among at least three clock signals under measurement that include the first and the second clock signals and a third clock signal, the method comprising the steps of:

estimating instantaneous timing jitter sequences of the respective first, second and third clock signals under measurement to obtain first, second and third instantaneous timing jitter sequences or first, second and third instantaneous phase noises;

estimating a random component of a first clock skew between the first and third clock signals by calculating a timing difference sequence between the first and third instantaneous timing jitter sequences;

estimating a random component of a second clock skew between the second and third clock signals by calculating a timing difference sequence between the second and third timing jitter sequences; and estimating a random component of the clock skew between the first and second clock signals by calculating a difference between the random components of the first and second clock skews.

33. The method according to claim 32 further comprising the steps of:

estimating initial phase angles of the first, second and third clock signals under measurement to obtain first, second and third initial phase angles;

estimating a deterministic component of the first clock skew by calculating a difference between the first and third initial phase angles;

estimating a first clock skew sequence between the first and third clock signals by calculating a sum of the deterministic component and the random component of the first clock skew;

estimating a deterministic component of the second clock skew by calculating a difference between the second and third initial phase angles;

estimating a second clock skew sequence between the second and third clock signals by calculating a sum of the deterministic component and the random component of the second clock skew; and estimating a clock skew sequence between the first and second clock signals by calculating a difference between the first and second clock skew sequences.

34. The method according to claim 33 further comprising a step of assigning each timing jitter of the third instantaneous timing jitter sequence (M−1) times to estimate a frequency-multiplied instantaneous timing jitter sequence that is created by multiplying a frequency of the corresponding third clock signal under measurement by M, where M is an integer equal to or greater than two.

35. The method according to claim 32 further comprising a step of assigning each timing jitter of the third instantaneous timing jitter sequence (M−1) times to estimate a frequency-multiplied instantaneous timing jitter sequence that is created by multiplying a frequency of the corresponding third clock signal under measurement by M, where M is an integer equal to or greater than two.

36. The method according to claim 29 or 33, wherein said step of estimating an instantaneous timing jitter sequence comprises the steps of:

transforming a clock signal under measurement into a complex analytic signal;

obtaining an instantaneous phase of the clock signal under measurement from the analytic signal;

converting the instantaneous phase into a continuous instantaneous phase;

estimating, from the continuous instantaneous phase, a linear instantaneous phase and an initial phase angle;

obtaining an instantaneous phase noise by removing the linear instantaneous phase from the continuous instantaneous phase; and estimating an instantaneous timing jitter sequence of the clock signal under measurement from the instantaneous phase noise.

37. The method according to claim 36, wherein the step of estimating an instantaneous timing jitter sequence further comprises the steps of sampling the instantaneous phase noise at timings close to zero-crossing timings of a real part of the analytic signal.

38. The method according to claim 28 or 32, wherein said step of estimating an instantaneous timing jitter sequence comprises the steps of:
   transforming a clock signal under measurement into a complex analytic signal;
   obtaining an instantaneous phase of the clock signal under measurement from the analytic signal;
   converting the instantaneous phase into a continuous instantaneous phase;
   estimating, from the continuous instantaneous phase, linear instantaneous phase;
   obtaining an instantaneous phase noise by removing the linear instantaneous phase from the continuous instantaneous phase; and
   estimating an instantaneous timing jitter sequence of the clock signal under measurement from the instantaneous phase noise.

39. The method according to claim 38, wherein the step of estimating an instantaneous timing jitter sequence further comprises the steps of sampling the instantaneous phase noise at timings close to zero-crossing timings of a real part of the analytic signal.

40. A method of measuring a clock skew between at least a first and a second clock signals under measurement comprising the steps of:
   transforming the first and second clock signals into first and second complex analytic signals;
   estimating initial phase angles of the first and second clock signals from the first and second complex analytic signals to obtain first and second initial phase angles; and
   estimating a deterministic component of the clock skew between the first and second clock signals by calculating a difference between the first and second initial phase angles.

41. A method of measuring a clock skew between first and second clock signals among at least three clock signals under measurement that include the first and the second clock signals and a third clock signal, the method comprising the steps of:
   estimating initial phase angles of the first, second and third clock signals to obtain first, second and third initial phase angles;
   estimating a deterministic component of a first clock skew between the first and third clock signals by calculating a difference between the first and third initial phase angles;
   estimating a deterministic component of a second clock skew between the second and third clock signals by calculating a difference between the second and third initial phase angles; and
   estimating a deterministic component of the clock skew between the first and second clock signals by calculating a difference between the deterministic components of the first and second clock skews.

42. The method according to any one of claims 40 and 41, wherein said step of estimating an initial phase angle comprises the steps of:
   transforming a clock signal under measurement into a complex analytic signal;
   obtaining an instantaneous phase of the clock signal under measurement from the analytic signal;
   converting the instantaneous phase into a continuous instantaneous phase; and
   estimating, from the continuous instantaneous phase and the initial phase angle.

43. The method according to claim 29 or 40, wherein said step of estimating a deterministic component of the clock skew between the first and second clock signals comprises the steps of:
   estimating an offset position at which either a correlation between the first and second instantaneous timing jitter sequences or a correlation between the initial phase noises of the first and second clock signals under measurement shows the maximum value to obtain an offset value between corresponding clock edges of the first and second clock signals under measurement; and
   estimating the deterministic component of the clock skew between the first and second clock signals from the offset value and the first and second initial phase angles.

44. The method according to claim 33 or 41, wherein the step of estimating the deterministic component of the first clock skew comprises:
   estimating an offset position at which either a correlative value between the first and second instantaneous timing jitter sequences or a correlative value between the instantaneous phase noises of the first and third clock signals becomes the largest value to obtain a first offset value between corresponding clock edges of the first and third clock signals under measurement, and
   calculating a deterministic component of the first clock skew from the first and second initial phase angles and the first offset value; and the step of estimating the deterministic component of the second clock skew comprises:
   estimating an offset position at which either a correlative value between the third and fourth instantaneous timing jitter sequences or a correlative value between the instantaneous phase noises of the second and third clock signals becomes the largest value to obtain a second offset value between corresponding clock edges of the second and third clock signals under measurement, and
   calculating a deterministic component of the second clock skew from the second and third initial phase angles and the second offset value.

45. The method according to claim 28 or 32 further comprising the steps of digitizing an input analog signal into a digital signal when the clock signal under measurement is the analog signal.

* * * * *